US012648141B2

(12) United States Patent
Kang et al.

(10) Patent No.: US 12,648,141 B2
(45) Date of Patent: Jun. 2, 2026

(54) THREE-DIMENSIONAL (3D) SEMICONDUCTOR MEMORY DEVICE, METHOD OF MANUFACTURING THE SAME, AND ELECTRONIC SYSTEM INCLUDING THE SAME

(71) Applicant: Samsung Electronics Co., Ltd., Suwon-si (KR)

(72) Inventors: Shinhwan Kang, Suwon-si (KR); Jae-Hwang Sim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 449 days.

(21) Appl. No.: 18/469,705

(22) Filed: Sep. 19, 2023

(65) Prior Publication Data

US 2024/0324205 A1    Sep. 26, 2024

(30) Foreign Application Priority Data

Mar. 20, 2023    (KR) ........................ 10-2023-0035639

(51) Int. Cl.
H10B 43/27 (2023.01)
H10B 41/27 (2023.01)
(52) U.S. Cl.
CPC ............. H10B 43/27 (2023.02); H10B 41/27 (2023.02)

(58) Field of Classification Search
CPC ................................ H10B 43/27; H10B 41/27
See application file for complete search history.

(56) References Cited

U.S. PATENT DOCUMENTS

| | | | |
|---|---|---|---|
| 9,331,082 B2 | 5/2016 | Lee et al. | |
| 11,296,021 B2 | 4/2022 | Lee | |
| 2022/0157831 A1* | 5/2022 | Baek | H10B 43/40 |
| 2022/0216151 A1* | 7/2022 | Kim | H10B 43/40 |

FOREIGN PATENT DOCUMENTS

| | | |
|---|---|---|
| CN | 114497052 A | 5/2022 |
| CN | 114678365 A | 6/2022 |
| CN | 114678372 A | 6/2022 |
| CN | 115036292 A | 9/2022 |

* cited by examiner

*Primary Examiner* — Steven M Page
(74) *Attorney, Agent, or Firm* — Wolf, Greenfield & Sacks, P.C.

(57)    ABSTRACT

A 3D semiconductor memory device includes a source structure, a gate stack structure disposed on the source structure and comprising insulating patterns and conductive patterns which are alternately stacked, a through-plug, a pad in contact with the through-plug, and a pad insulating pattern under the pad. The conductive patterns include a selection conductive line in contact with the through-plug. The through-plug includes an extension plug portion and a parallel plug portion. A height of the pad is less than a height of the conductive pattern.

20 Claims, 32 Drawing Sheets

THREE-DIMENSIONAL (3D) SEMICONDUCTOR MEMORY DEVICE, METHOD OF MANUFACTURING THE SAME, AND ELECTRONIC SYSTEM INCLUDING THE SAME

CROSS-REFERENCE TO RELATED APPLICATION(S)

This U.S. non-provisional patent application claims priority under 35 U.S.C. § 119 to Korean Patent Application No. 10-2023-0035639, filed on Mar. 20, 2023, in the Korean Intellectual Property Office, the entire contents of which are hereby incorporated by reference.

BACKGROUND

The present disclosure relates to a three-dimensional (3D) semiconductor memory device, a method of manufacturing the same and an electronic system including the same, and more particularly, to a non-volatile 3D semiconductor memory device including a vertical channel, a method of manufacturing the same and an electronic system including the same.

An electronic system requiring data storage may require a semiconductor device capable of storing high-capacity data. To meet performance and cost objectives of a semiconductor device while increasing data storage capacity of the semiconductor device, it may be required to increase an integration density of the semiconductor device. An integration density of a two-dimensional (2D) or planar semiconductor device may be mainly determined by an area where a unit memory cell occupies, and thus the integration density of the 2D or planar semiconductor device may be greatly affected by a technique of forming fine patterns (i.e., scaling). However, since extremely high-priced apparatuses are needed to form fine patterns, the integration density of 2D semiconductor devices continues to increase but is still limited. Thus, three-dimensional (3D) semiconductor memory devices including three-dimensionally arranged memory cells have been developed to address at least some of the above limitations.

SUMMARY

Embodiments of the inventive concepts may provide a three-dimensional (3D) semiconductor memory device capable of improving electrical characteristics and of being easily manufactured, and a method of manufacturing the same.

Embodiments of the inventive concepts may also provide an electronic system including the 3D semiconductor memory device.

In an aspect, a 3D semiconductor memory device may include a source structure including a cell region and an extension region, a gate stack structure disposed on the source structure and comprising insulating patterns and conductive patterns which are alternately stacked, a through-plug penetrating the gate stack structure and the extension region of the source structure, a pad in contact with the through-plug, and a pad insulating pattern under the pad. The conductive patterns may include a selection conductive line in contact with the through-plug. The through-plug may include an extension plug portion extending in a first direction, and a parallel plug portion extending in a second direction intersecting the first direction. A height of the pad may be less than a height of the conductive pattern.

In an aspect, a 3D semiconductor memory device may include a source structure including a cell region and an extension region, a gate stack structure disposed on the source structure and comprising insulating patterns and conductive patterns which are alternately stacked, a through-plug penetrating the gate stack structure and the extension region of the source structure, and a pad in contact with the through-plug. The conductive patterns may include a selection conductive line in contact with the through-plug. The through-plug may include an extension plug portion extending in a first direction, and a parallel plug portion extending in a second direction intersecting the first direction. A level of a top surface of the pad may be lower than a level of a top surface of the parallel plug portion.

In an aspect, an electronic system may include a main board, a three-dimensional (3D) semiconductor memory device on the main board, and a controller electrically connected to the 3D semiconductor memory device on the main board. The 3D semiconductor memory device may include a peripheral circuit structure including a transistor, a source structure on the peripheral circuit structure, the source structure including a cell region and an extension region, a gate stack structure disposed on the source structure and comprising insulating patterns and conductive patterns which are alternately stacked, a through-plug penetrating the gate stack structure and the extension region of the source structure, a pad in contact with the through-plug, and a pad insulating pattern under the pad. The conductive patterns may include a selection conductive line in contact with the through-plug. The through-plug may include an extension plug portion extending in a first direction, and a parallel plug portion extending in a second direction intersecting the first direction. A sum of a height of the pad insulating pattern and a height of the pad may be less than a height of the parallel plug portion. The height of the pad may be less than a height of the conductive pattern.

BRIEF DESCRIPTION OF THE DRAWINGS

FIGS. 3 and 4 are cross-sectional views taken along lines I-I' and II-II' of FIG. 2, respectively, to illustrate a semiconductor package including a 3D semiconductor memory device according to some embodiments of the inventive concepts.

FIG. 5 is a plan view illustrating at least a portion of an example 3D semiconductor memory device, according to some embodiments of the inventive concepts.

FIGS. 10 to 12, 14, 16, 18, 20, 22, 24, 26, 28, 30 and 32 are cross-sectional views taken along line A-A' of FIG. 5 to illustrate intermediate processing in an example method of manufacturing a 3D semiconductor memory device, according to some embodiments of the inventive concepts.

DETAILED DESCRIPTION

Figure 1:
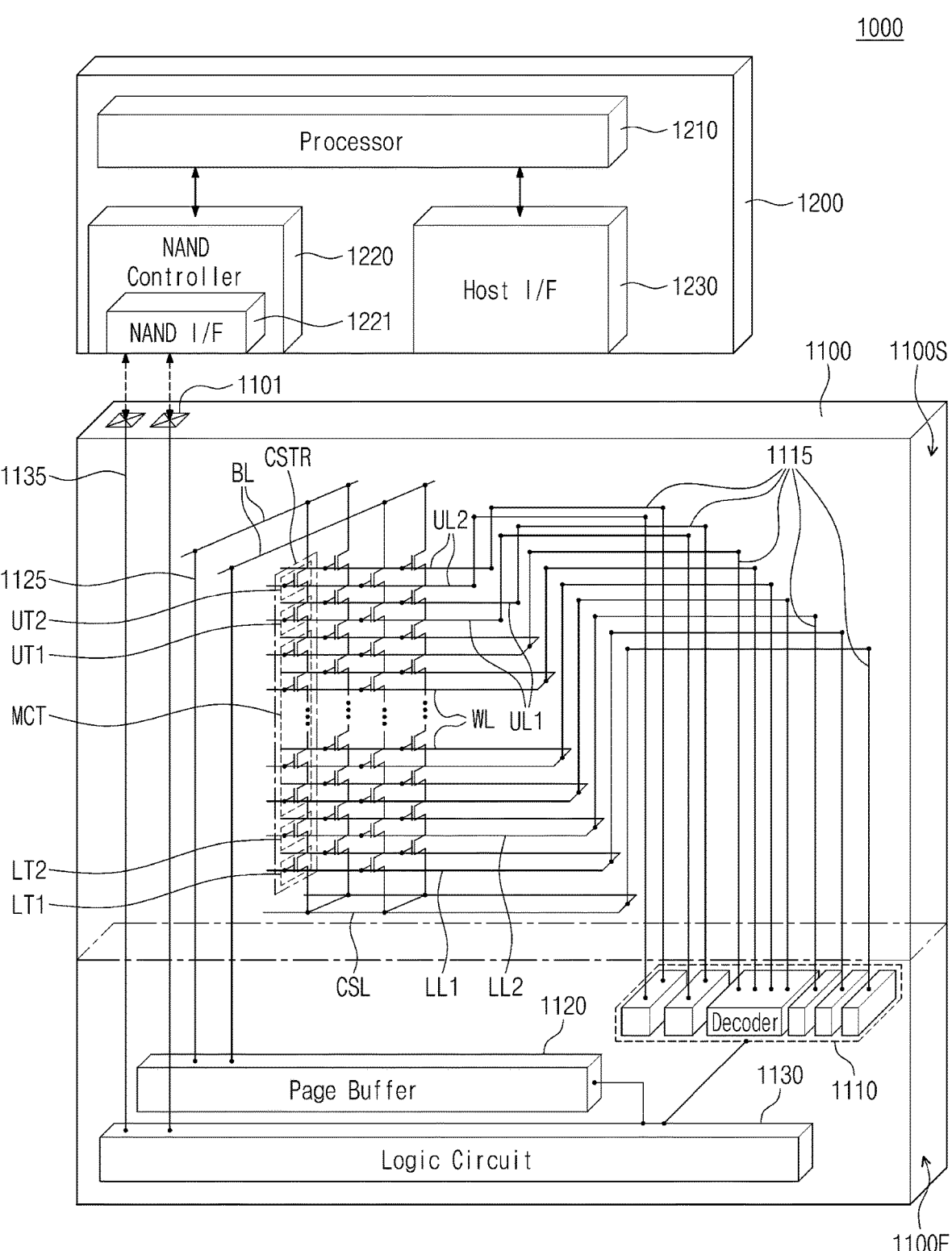
FIG. 1 is a schematic view illustrating at least a portion of an example electronic system including a three-dimensional (3D) semiconductor memory device, according to some embodiments of the inventive concepts.

Embodiments of the inventive concepts will now be described more fully with reference to the accompanying drawings, wherein like reference numerals (when used) indicate corresponding elements throughout the several views.

FIG. 1 is a schematic view illustrating at least a portion of an example electronic system including a three-dimensional (3D) semiconductor memory device, according to some embodiments of the inventive concepts.

Referring to FIG. 1, an electronic system 1000 according to some embodiments of the inventive concepts may include a 3D semiconductor memory device 1100 and a controller 1200 electrically connected to the 3D semiconductor memory device 1100. The electronic system 1000 may be a storage device including one or more 3D semiconductor memory devices 1100, or an electronic device including the storage device. For example, the electronic system 1000 may be a solid state drive (SSD) device, a universal serial bus (USB) device, a computing system, a medical device or a communication device, which includes the one or more 3D semiconductor memory devices 1100.

The 3D semiconductor memory device 1100 may be a non-volatile memory device and may be, for example, a 3D NAND flash memory device to be described later. The 3D semiconductor memory device 1100 may include a first region 1100F and a second region 1100S on the first region 1100F. In certain embodiments, unlike FIG. 1, the first region 1100F may be disposed at a side of the second region 1100S. The first region 1100F may be a peripheral circuit region including a decoder circuit 1110, a page buffer 1120, and a logic circuit 1130. The second region 1100S may be a memory cell region including bit lines BL, a common source line CSL, word lines WL, first lines LL1 and LL2, second lines UL1 and UL2, and memory cell strings CSTR, each of the memory cell strings CSTR connected between the common source line CSL and a corresponding one of the bit lines BL.

In the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and the number of the second transistors UT1 and UT2 may be variously changed.

For example, the first transistors LT1 and LT2 may include a ground selection transistor, and the second transistors UT1 and UT2 may include a string selection transistor. The first lines LL1 and LL2 may be gate electrodes of the first transistors LT1 and LT2, respectively. The word lines WL may be gate electrodes of the memory cell transistors MCT. The second lines UL1 and UL2 may be gate electrodes of the second transistors UT1 and UT2, respectively.

For example, the first transistors LT1 and LT2 may include a first erase control transistor LT1 and a ground selection transistor LT2, which are connected in series with each other. The second transistors UT1 and UT2 may include a string selection transistor UT1 and a second erase control transistor UT2, which are connected in series with each other. At least one of the first erase control transistor LT1 and the second erase control transistor UT2 may be used in an erase operation for erasing data stored in the memory cell transistors MCT by using a gate induced drain leakage (GIDL) phenomenon.

The common source line CSL, the first lines LL1 and LL2, the word lines WL and the second lines UL1 and UL2 may be electrically connected to the decoder circuit 1110 through first connection lines 1115 extending (e.g., vertically) from the inside of the first region 1100F into the second region 1100S. The bit lines BL may be electrically connected to the page buffer 1120 through second connection lines 1125 extending (e.g., vertically) from the inside of the first region 1100F into the second region 1100S.

In the first region 1100F, the decoder circuit 1110 and the page buffer 1120 may perform a control operation on at least one selected memory cell transistor MCT from the plurality of memory cell transistors MCT. The decoder circuit 1110 and the page buffer 1120 may be controlled by the logic circuit 1130. The 3D semiconductor memory device 1100 may communicate with the controller 1200 through one or more input/output pads 1101 electrically connected to the logic circuit 1130. The input/output pads 1101 may be electrically connected to the logic circuit 1130 through corresponding input/output connection lines 1135 extending (e.g., vertically) from the inside of the first region 1100F into the second region 1100S.

The controller 1200 may include a processor 1210, a NAND controller 1220, and a host interface (I/F) 1230. For example, the electronic system 1000 may include a plurality of the 3D semiconductor memory devices 1100, and the controller 1200 may be configured to control the plurality of 3D semiconductor memory devices 1100.

The processor 1210 may be configured to control overall operations of the electronic system 1000 including the controller 1200. The processor 1210 may operate according to predetermined firmware and may be configured to control the NAND controller 1220 to access the 3D semiconductor memory device 1100. The NAND controller 1220 may include a NAND interface 1221 configured for processing communication with the 3D semiconductor memory device 1100. A control command for controlling the 3D semiconductor memory device 1100, data to be written in the memory cell transistors MCT of the 3D semiconductor memory device 1100, and/or data to be read from the memory cell transistors MCT of the 3D semiconductor memory device 1100 may be transmitted through the NAND interface 1221. The host interface 1230 may provide a communication function between the electronic system 1000 and an external host (not explicitly shown, but implied). When a control command is received from the external host through the host interface 1230, the processor 1210 may control the 3D semiconductor memory device 1100 in response to the control command.

Figure 2:
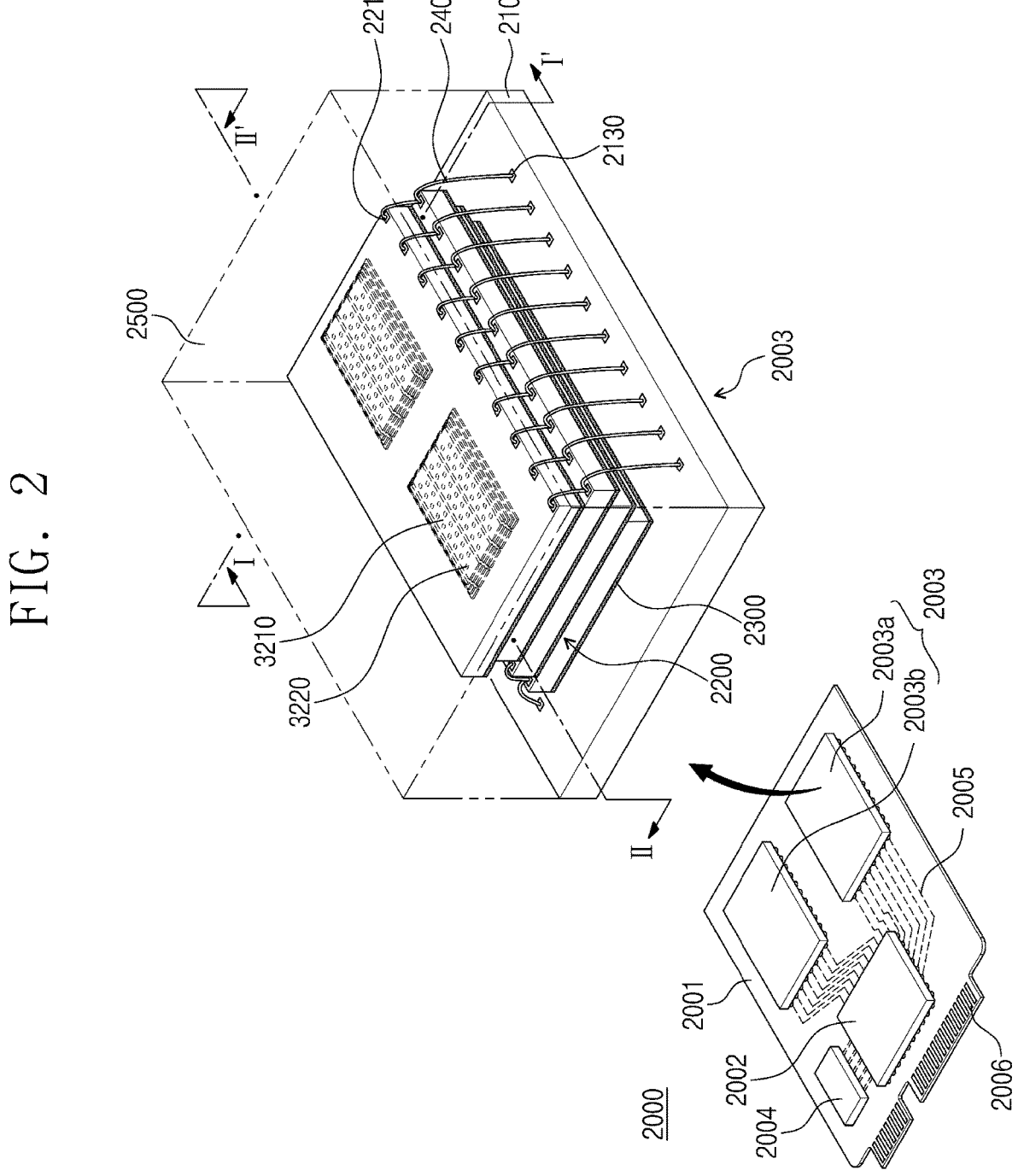
FIG. 2 is a perspective view schematically illustrating an example electronic system including a 3D semiconductor memory device, according to some embodiments of the inventive concepts.

FIG. 2 is a perspective view schematically illustrating at least a portion of an example electronic system 2000 including a 3D semiconductor memory device, according to some embodiments of the inventive concepts.

Referring to FIG. 2, the electronic system 2000 according to some embodiments of the inventive concepts may include a main board 2001, and a controller 2002, at least one or more semiconductor packages 2003 and a DRAM 2004 which are disposed on the main board 2001.

The semiconductor package 2003 and the DRAM 2004 may be electrically connected to the controller 2002 through wiring patterns 2005 (e.g., conductive traces) provided on and/or within the main board 2001.

The main board 2001 may include a connector 2006 including a plurality of pins coupled to an external host (not explicitly shown, but implied). The number and arrangement of the plurality of pins of the connector 2006 may be changed according to a communication interface between the electronic system 2000 and the external host. For example, the electronic system 2000 may communicate with the external host through one of a universal serial bus (USB) interface, a peripheral component interconnect express (PCI-express) interface, a serial advanced technology attachment (SATA) interface, and a M-Phy interface for a universal flash storage (UFS), or any other standard or proprietary interface. For example, the electronic system 2000 may operate by power supplied from the external host through the connector 2006. The electronic system 2000 may further include a power management integrated circuit (PMIC) for distributing the power supplied from the external host to the controller 2002 and the semiconductor package 2003.

The controller 2002 may write data in the semiconductor package 2003 and/or read data from the semiconductor package 2003 and may improve an operation speed of the electronic system 2000.

The DRAM 2004 may comprise a buffer memory for reducing a speed difference between the external host and the semiconductor package 2003 corresponding to a data storage space. The DRAM 2004 included in the electronic system 2000 may also operate as a cache memory and may provide a space for temporarily storing data in an operation of controlling the semiconductor package 2003. In the case in which the electronic system 2000 includes the DRAM 2004, the controller 2002 may further include a DRAM controller for controlling the DRAM 2004 in addition to a NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chips 2200 on the package substrate 2100, adhesive layers 2300 disposed on bottom surfaces of the semiconductor chips 2200, respectively, a connection structure 2400 electrically connecting the semiconductor chips 2200 to the package substrate 2100, and a molding layer 2500 covering (i.e., on or over) the semiconductor chips 2200 and the connection structure 2400 on the package substrate 2100. The term "covering" (or "cover" or other like terms) as used herein is intended to refer to a material, layer or structure being on or over another material, layer or structure, but does not require the material, layer or structure to entirely cover the other material, layer or structure. Thus, for example, a material or layer having openings or holes therein may still be considered to cover another material or layer.

The package substrate 2100 may be, for example, a printed circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a 3D semiconductor memory device as described later.

For example, the connection structure 2400 may include bonding wires electrically connecting the input/output pads 2210 to corresponding package upper pads 2130. In each of the first and second semiconductor packages 2003a and 2003b, the semiconductor chips 2200 may be electrically connected to each other by the bonding wire method and may be electrically connected to the package upper pads 2130 of the package substrate 2100 by the bonding wire method. According to certain embodiments, in each of the first and second semiconductor packages 2003a and 2003b, the semiconductor chips 2200 may be electrically connected to each other by through-silicon vias (TSVs), instead of the connection structure 2400 including the bonding wires.

In certain embodiments, the controller 2002 and the semiconductor chips 2200 may be included in a single package. In this case, the controller 2002 and the semiconductor chips 2200 may be mounted on an interposer substrate different from the main board 2001, and the controller 2002 and the semiconductor chips 2200 may be connected to each other by wiring lines provided on and/or within the interposer substrate.

Figure 3:
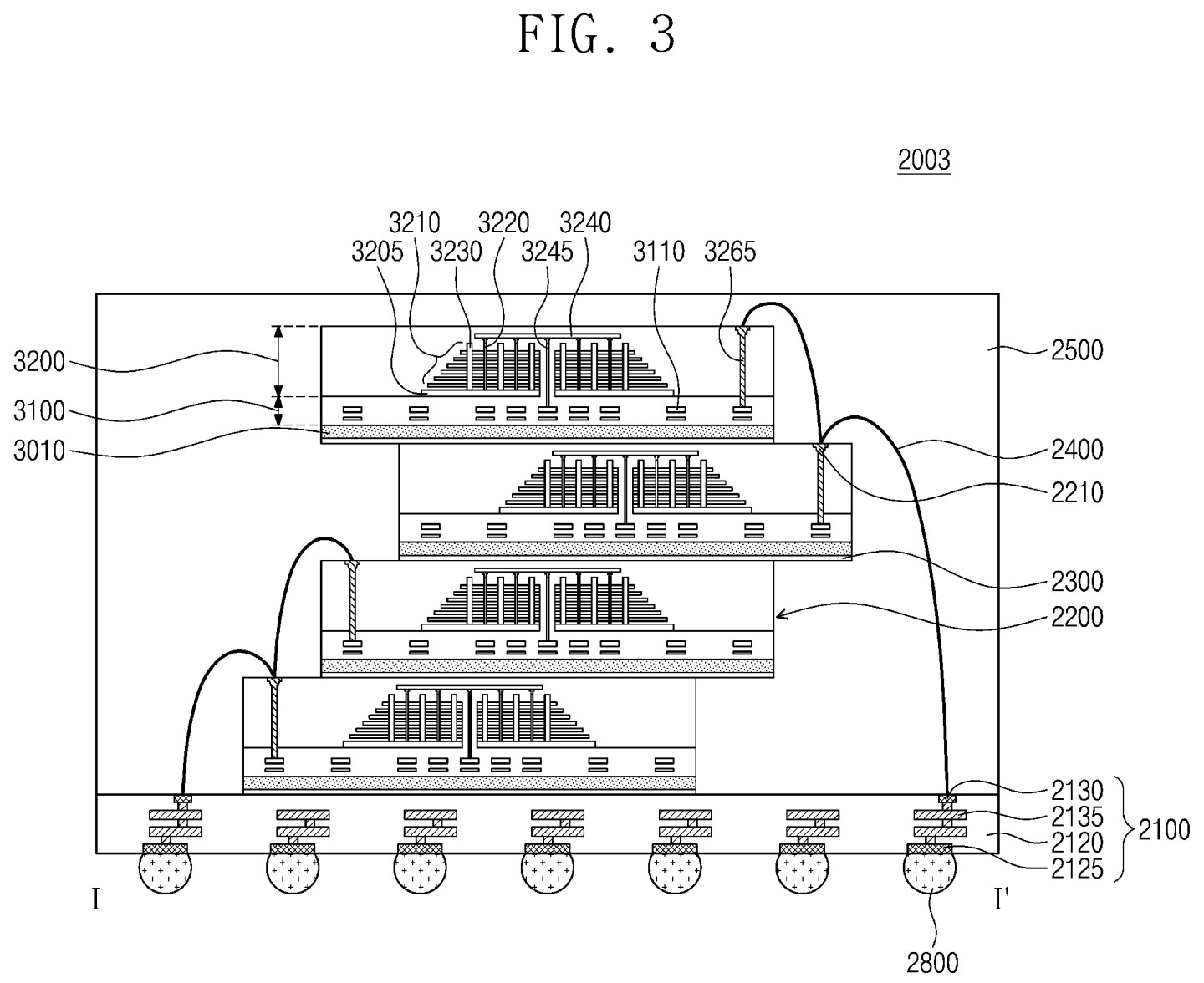
Figure 4:
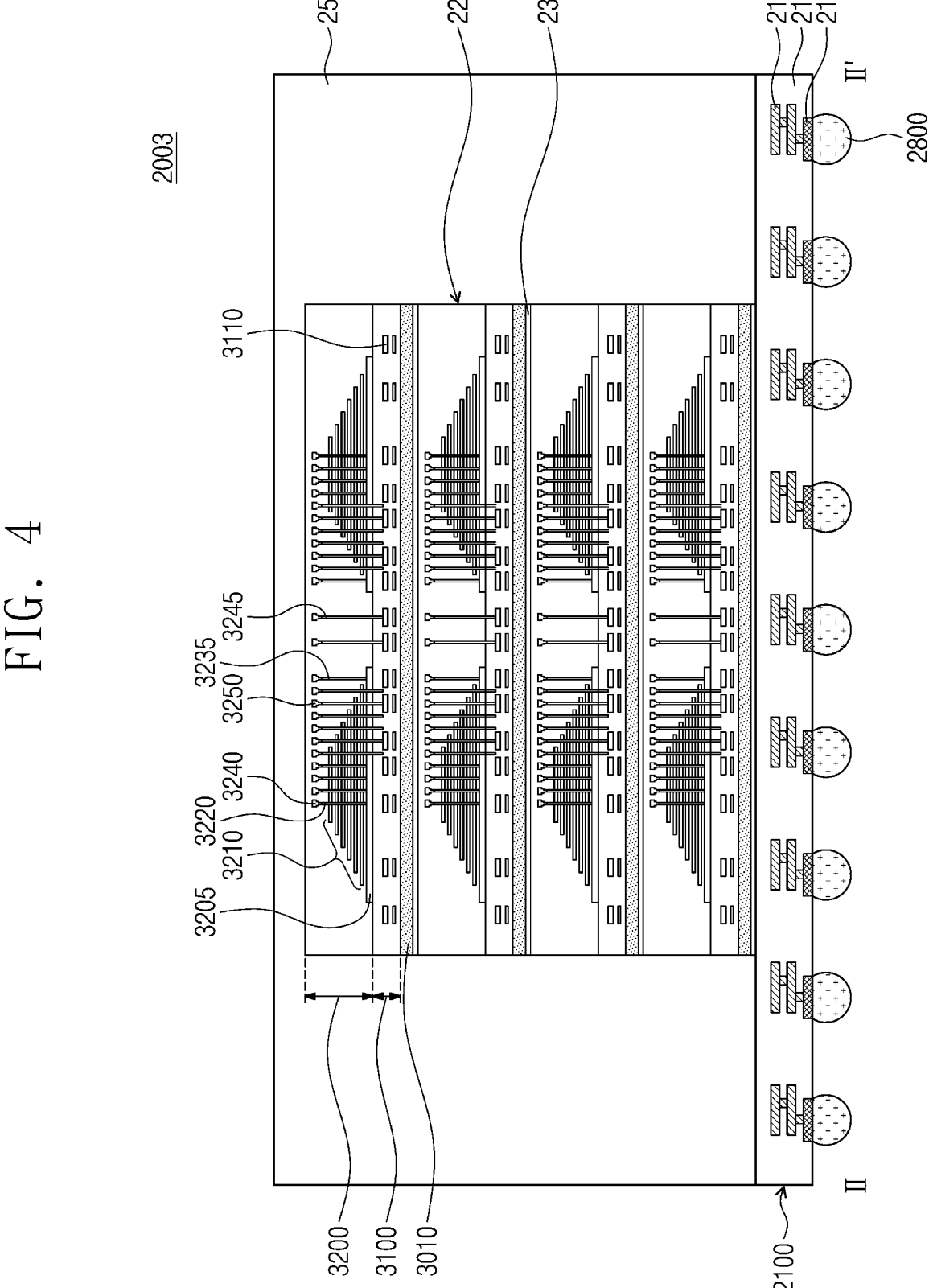

FIGS. 3 and 4 are cross-sectional views taken along lines I-I' and II-II' of FIG. 2, respectively, to illustrate a semiconductor package including a 3D semiconductor memory device according to some embodiments of the inventive concepts.

Referring to FIGS. 3 and 4, the semiconductor package 2003 may include the package substrate 2100, a plurality of the semiconductor chips 2200 on the package substrate 2100, and the molding layer 2500 covering the package substrate 2100 and the plurality of semiconductor chips 2200.

The package substrate 2100 may include a package substrate body portion 2120, the package upper pads 2130 disposed at a top surface of the package substrate body portion 2120, package lower pads 2125 disposed at a bottom surface of the package substrate body portion 2120 or exposed through the bottom surface, and internal wiring lines 2135 disposed in the package substrate body portion 2120 to electrically connect the package upper pads 2130 to the package lower pads 2125. The package upper pads 2130 may be electrically connected to the connection structures 2400 (e.g., bond wires). The package lower pads 2125 may be connected to the wiring patterns 2005 of the main board 2001 of the electronic system 2000 shown in FIG. 2 through conductive connection portions 2800. The conductive portions 2800 may comprise, for example, solder bumps (e.g., controlled collapse chip connection (C4) bumps, under bump metallization (UBM), etc.), copper (Cu) pillars, or other conductive structures.

Each (or at least a subset) of the semiconductor chips 2200 may include a semiconductor substrate 3010, and first and second structures 3100 and 3200, respectively, sequentially stacked on the semiconductor substrate 3010. The first structure 3100 may include a peripheral circuit region including peripheral interconnection lines 3110. The second structure 3200 may include: a common source line 3205; a gate stack structure 3210 on the common source line 3205; vertical channel structures 3220 and separation structures 3230 which penetrate the gate stack structure 3210; bit lines 3240 electrically connected to the vertical channel structures 3220; and gate connection lines 3235 and conductive lines 3250 which are electrically connected to word lines (see WL of FIG. 1) of the gate stack structure 3210. Each of at least some of the gate connection lines 3235 may be electrically connected to a corresponding one of the word lines WL (FIG. 1) and may penetrate other word lines WL so as to be electrically connected to a corresponding one of the peripheral interconnection lines 3110 of the first structure 3100. At least one of the gate connection lines 3235 may be electrically connected to the common source line 3205. The gate connection lines 3235 electrically connected to the word lines WL may be formed simultaneously with a through-line 3245.

Each of the semiconductor chips 2200, in some embodiments, may include the through-line 3245 which is electrically connected to the peripheral interconnection line 3110 of the first structure 3100 and extends into the second structure 3200. The through-line 3245 may penetrate the gate stack structure 3210, and an additional through-line 3245 may be disposed outside the gate stack structure 3210. Each of the semiconductor chips 2200 may further include an input/output connection line 3265 electrically connected to the peripheral interconnection line 3110 of the first structure 3100 and extending into the second structure 3200, and an input/output pad 2210 electrically connected to the input/output connection line 3265.

Figure 5:
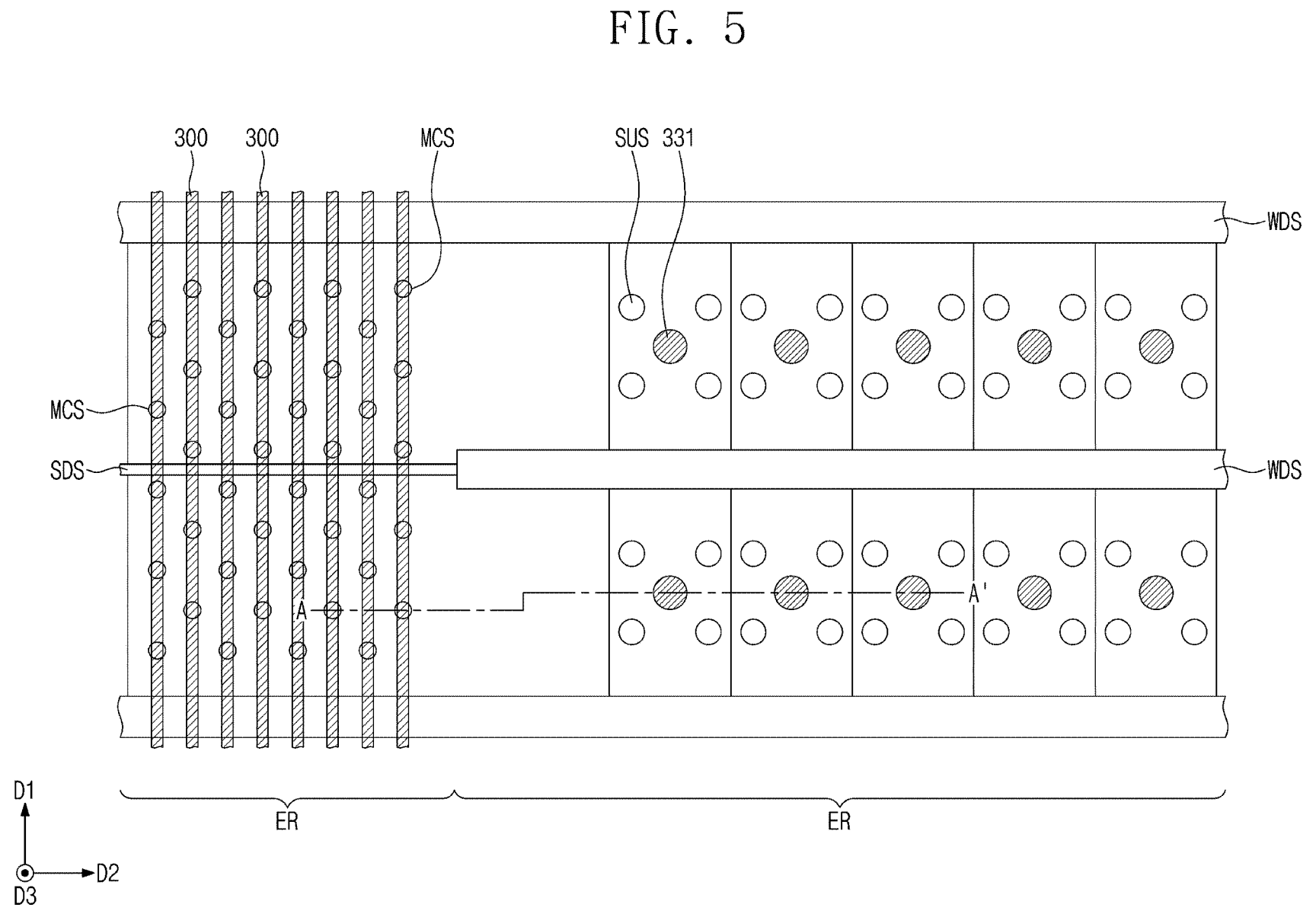
Figure 6:
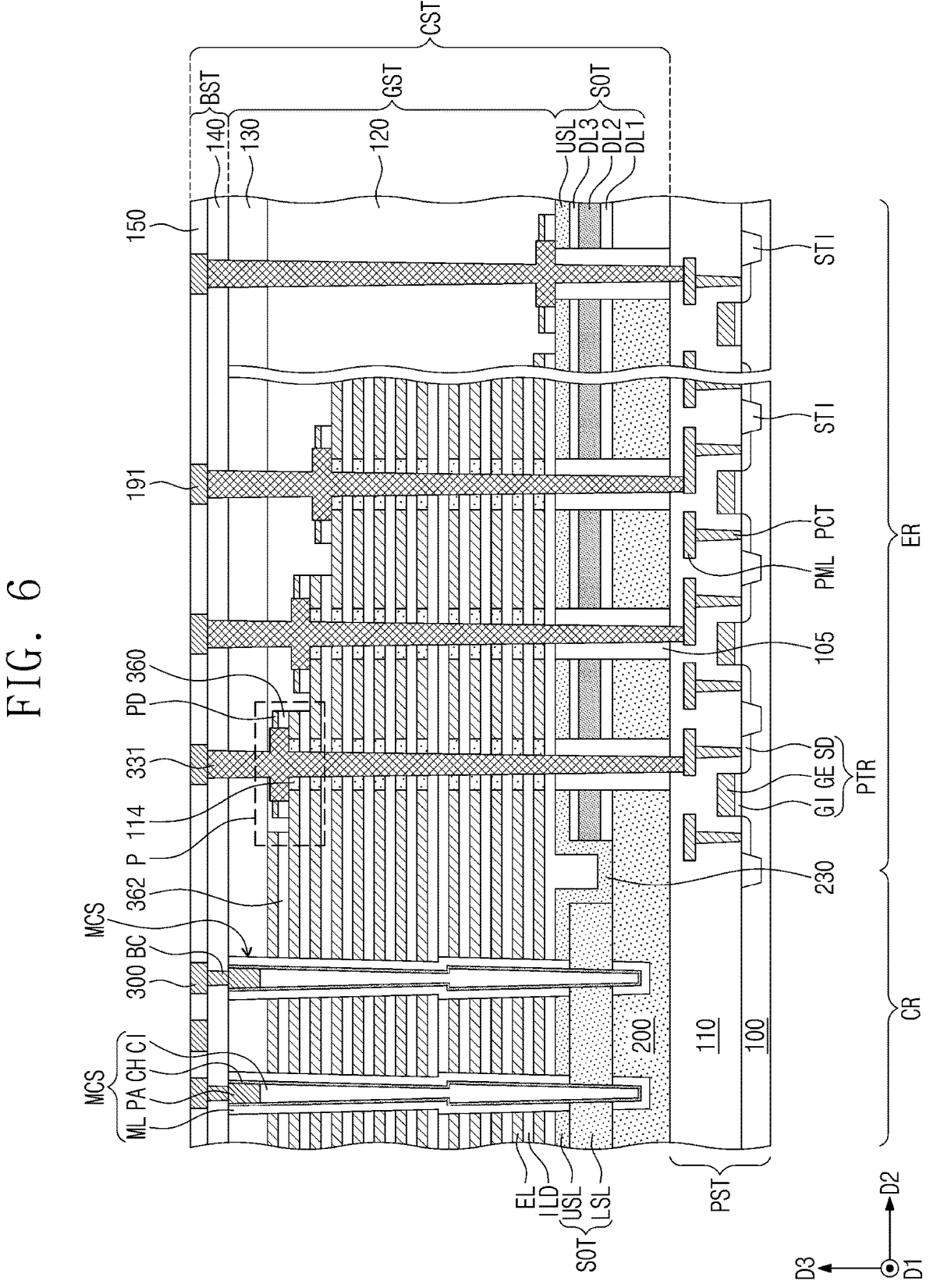
FIG. 6 is a cross-sectional view taken along a line A-A' of FIG. 5.

FIG. 5 is a plan view illustrating a 3D semiconductor memory device according to some embodiments of the inventive concepts. FIG. 6 is a cross-sectional view taken along a line A-A' of FIG. 5.

Referring to FIGS. 5 and 6, a 3D semiconductor memory device according to some embodiments of the inventive concepts may include a peripheral circuit structure PST and a memory cell structure CST. The memory cell structure CST may be provided on the peripheral circuit structure PST.

The peripheral circuit structure PST may include a substrate 100. The substrate 100 may have a plate shape extending along a plane defined by a first direction D1 and a second direction D2. The first direction D1 and the second direction D2 may intersect each other. For example, the first direction D1 and the second direction D2 may be perpendicular to each other. In some embodiments, the substrate 100 may be a semiconductor substrate. For example, the substrate 100 may be a silicon substrate. In certain embodiments, the substrate 100 may be a silicon-on-insulator (SOI) substrate. It is to be understood that embodiments of the inventive concept are not limited to any specification type of substrate 100.

The peripheral circuit structure PST may further include a peripheral insulating layer 110 on the substrate 100. The peripheral insulating layer 110 may cover a top surface of the substrate 100. The peripheral insulating layer 110 may include an insulating material. For example, the peripheral insulating layer 110 may include an oxide. In some embodiments, the peripheral insulating layer 110 may include a plurality of stacked insulating layers.

The peripheral circuit structure PST may further include peripheral transistors PTR. The peripheral transistors PTR may be provided between the substrate 100 and the peripheral insulating layer 110. The peripheral transistor PTR may include source/drain regions SD, a gate electrode GE, and a gate insulating layer GI. The gate electrode GE and the gate insulating layer GI may be provided on the substrate 100 between the laterally spaced (i.e., in the direction D2) source/drain regions SD. The gate electrode GE may be spaced apart from the substrate 100 (in a direction D3 perpendicular to the plane defined by directions D1 and D2) by the gate insulating layer GI. The source/drain regions SD may be formed by doping portions of the substrate 100 with dopants. The gate electrode GE may include a conductive material. The gate insulating layer GI may include an insulating material.

The peripheral circuit structure PST may further include device isolation layers STI (e.g., shallow trench isolation (STI) structures). The device isolation layers STI may be provided in the substrate 100. The device isolation layer STI may be disposed between the peripheral transistors PTR to electrically isolate the peripheral transistors PTR from each other. The device isolation layer STI may include an insulating material.

The peripheral circuit structure PST may further include peripheral contacts PCT and peripheral interconnection lines PML. The peripheral contact PCT may be connected to the peripheral transistor PTR, and the peripheral interconnection line PML may be connected to the peripheral contact PCT. The peripheral contact PCT and the peripheral interconnection line PML may be provided in the peripheral insulating layer 110. The peripheral contact PCT and the peripheral interconnection line PML may include a conductive material.

The memory cell structure CST may include a semiconductor layer 200, a source structure SOT, a gate stack structure GST, memory channel structures MCS, support structures SUS, separation structures WDS, through-plugs 331, and a bit line structure BST.

The semiconductor layer 200 may be disposed on the peripheral insulating layer 110 of the peripheral circuit structure PST. The semiconductor layer 200 may include an extrinsic semiconductor material doped with dopants and/or an intrinsic semiconductor material not doped with dopants. For example, the semiconductor layer 200 may include at least one of silicon (Si), germanium (Ge), silicon-germanium (SiGe), gallium arsenic (GaAs), indium gallium arsenic (InGaAs), aluminum gallium arsenic (AlGaAs), or a mixture thereof.

The source structure SOT may include a cell region CR and an extension region ER. The cell region CR and the extension region ER of the source structure SOT may be regions divided from each other in a plan view defined by the first direction D1 and the second direction D2.

The source structure SOT may be provided on the semiconductor layer 200. The source structure SOT may include a lower source layer LSL, an upper source layer USL, a first dummy layer DL1, a second dummy layer DL2, and a third dummy layer DL3. The lower source layer LSL, the upper source layer USL, the first dummy layer DL1, the second dummy layer DL2 and the third dummy layer DL3 may be provided on the semiconductor layer 200.

The lower source layer LSL may be provided on the semiconductor layer 200. The lower source layer LSL may be disposed in the cell region CR. The lower source layer LSL may include a conductive material. For example, the lower source layer LSL may include dopant-doped polysilicon.

The first dummy layer DL1, the second dummy layer DL2 and the third dummy layer DL3 may be sequentially stacked on the semiconductor layer 200 in a third direction D3. The third direction D3 may intersect the first direction D1 and the second direction D2. For example, the third direction D3 may be perpendicular to the first direction D1 and the second direction D2.

The first to third dummy layers DL1, DL2 and DL3 may be disposed in the extension region ER. The first to third dummy layers DL1, DL2 and DL3 may be disposed at the same level (in the direction D3) as the lower source layer LSL (i.e., an upper surface of the dummy layer DL3 may be coplanar with an upper surface of the lower source layer LSL). The first to third dummy layers DL1, DL2 and DL3 may include insulating materials. In some embodiments, the first and third dummy layers DL1 and DL3 may include the same insulating material, and the second dummy layer DL2 may include an insulating material different from that of the first and third dummy layers DL1 and DL3. For example, the second dummy layer DL2 may include silicon nitride, and the first and third dummy layers DL1 and DL3 may include silicon oxide.

The upper source layer USL may cover the lower source layer LSL and the first to third dummy layers DL1, DL2 and DL3. The upper source layer USL may extend from the cell region CR into the extension region ER. The upper source layer USL may include a semiconductor material. For example, the upper source layer USL may include dopant-doped poly-silicon or undoped poly-silicon. The upper source layer USL may include a source separation portion 230. The source separation portion 230 may be located between the cell region CR and the extension region ER (e.g., at a boundary between the cell region CR and the extension region ER). The source separation portion 230 may be located between the lower source layer LSL and the first to third dummy layers DL1, DL2 and DL3.

The gate stack structure GST may be provided on the source structure SOT. The gate stack structure GST may include an insulating pattern ILD and a conductive pattern EL which are alternately stacked in the third direction D3. The gate stack structure GST may include a gate insulating layer 120 on the insulating pattern ILD and the conductive pattern EL which are alternately stacked. The gate stack structure GST may include a first insulating layer 130 on the gate insulating layer 120. The insulating pattern ILD may include an insulating material. For example, the insulating pattern ILD may include an oxide. The conductive pattern EL may include a conductive material. The insulating pattern ILD and the conductive pattern EL may include a plurality of insulating patterns ILD and a plurality of conductive patterns EL. One of the insulating patterns ILD, which is disposed at the same level as a pad insulating pattern 360 to be described later, may be defined as an adjacent insulating pattern 362.

The memory channel structures MCS may be disposed on the cell region CR. The memory channel structures MCS may extend in the third direction D3 to penetrate the conductive patterns EL and the insulating patterns ILD of the gate stack structure GST and the upper source layer USL and the lower source layer LSL of the source structure SOT. The memory channel structures MCS may penetrate the gate stack structure GST so as to be electrically connected to the cell region CR of the source structure SOT. The memory channel structures MCS may be surrounded by the insulating patterns ILD and the conductive patterns EL of the gate stack structure GST. A lowermost portion of the memory channel structure MCS may be disposed in the semiconductor layer 200. The term "surround" ("surrounding" or "surrounded") as may be used herein is intended to broadly refer to a component, structure or layer that envelops, encircles, or encloses another component, structure or layer on all sides, although breaks or gaps may also be present. Thus, for example, a material layer having voids therein may still "surround" another layer which it encircles.

Each of the memory channel structures MCS may include a core insulating layer CI, a memory pad PA, a channel layer CH, and a memory layer ML. The core insulating layer CI may extend in the third direction D3 to penetrate the conductive patterns EL and the insulating patterns ILD of the gate stack structure GST and the upper source layer USL and the lower source layer LSL of the source structure SOT. The core insulating layer CI may include an insulating material. For example, the core insulating layer CI may include an oxide. The memory pad PA may be provided on the core insulating layer CI. The memory pad PA may include a conductive material.

The channel layer CH may surround (i.e., extend around) the core insulating layer CI and the memory pad PA. The channel layer CH may extend in the third direction D3 to penetrate the conductive patterns EL and the insulating patterns ILD of the gate stack structure GST and the upper source layer USL and the lower source layer LSL of the source structure SOT. The channel layer CH may cover a side surface and a bottom surface of the core insulating layer CI. The channel layer CH may be in contact with the lower source layer LSL of the source structure SOT. The phrase "in contact with" as used herein is intended to refer broadly to two or more elements, layers, surfaces, structures, etc., that interact with one another physically and/or electrically. The memory channel structure MCS may be electrically connected to the source structure SOT. The channel layer CH of the memory channel structure MCS may be electrically connected to the lower source layer LSL of the source structure SOT. The channel layer CH may include a semiconductor material. For example, the channel layer CH may include poly-silicon.

The memory layer ML may surround (i.e., extend around) the channel layer CH. The memory layer ML may extend in the third direction D3 to penetrate the conductive patterns EL and the insulating patterns ILD of the gate stack structure GST. The memory layer ML may be surrounded by the conductive patterns EL and the insulating patterns ILD of the gate stack structure GST.

The support structures SUS may be disposed on the extension region ER. The support structures SUS may extend in the third direction D3 to penetrate the conductive patterns EL and the insulating patterns ILD of the gate stack structure GST and the upper source layer USL and the first to third dummy layers DL1, DL2 and DL3 of the source structure SOT. The support structures SUS may penetrate the gate stack structure GST and may be connected to the extension region ER of the source structure SOT. The support structures SUS may include an insulating material. For example, the support structures SUS may include an oxide.

The separation structures WDS may extend from the cell region CR onto the extension region ER. The separation structures WDS may extend in the second direction D2. The separation structures WDS may penetrate the gate stack structure GST and may be connected to the source structure SOT. The separation structures WDS may extend in the third direction D3 to penetrate the conductive patterns EL and the insulating patterns ILD of the gate stack structure GST and the upper source layer USL, the first to third dummy layers DL1, DL2 and DL3 and the lower source layer LSL of the source structure SOT. The separation structures WDS may include an insulating material. For example, the separation structures WDS may include an oxide. In some embodiments, the separation structure WDS may further include a conductive material. A lowermost portion of the separation structure WDS may be disposed in the semiconductor layer 200.

The through-plug 331 may be disposed in the extension region ER. The through-plug 331 may extend in the third direction D3 to penetrate the insulating patterns ILD and the conductive patterns EL of the gate stack structure GST, the upper source layer USL and the first to third dummy layers DL1, DL2 and DL3 of the source structure SOT and the semiconductor layer 200.

Plug insulating patterns 114 may be located between the through-plug 331 and some conductive patterns EL of the gate stack structure GST. The through-plug 331 may be in contact with a pad PD and a pad insulating pattern 360. A plug insulating layer 105 may be located between the through-plug 331 and the semiconductor layer 200 and between the through-plug 331 and the source structure SOT.

The plug insulating patterns 114 and the plug insulating layer 105 may include an insulating material. The plug insulating patterns 114 may prevent the through-plug 331 from being electrically connected to the conductive patterns EL of the gate stack structure GST.

The plug insulating layer 105 may prevent the through-plug 331 from being directly connected to the semiconductor layer 200 and the source structure SOT. Due to the plug insulating patterns 114, the through-plug 331 may be electrically connected to a corresponding conductive pattern EL of the gate stack structure GST but may not be electrically connected to other conductive patterns EL. The through-plug 331 may include a conductive material. For example, the through-plug 331 may include tungsten. It is to be appreciated that embodiments of the inventive concept are not limited to any specific type(s) of material forming the through-plugs 331.

The bit line structure BST may be provided on the gate stack structure GST. The bit line structure BST may include a second insulating layer 140, a third insulating layer 150, a bit line contact BC, a bit line 300, and a conductive line 191.

The second insulating layer 140 may cover the gate stack structure GST, the memory channel structures MCS, and the support structures SUS. The second insulating layer 140 may cover top surfaces of the memory channel structures MCS and the support structures SUS.

The bit line contacts BC may be provided in the second insulating layer 140. The bit line contact BC may penetrate the second insulating layer 140 so as to be in contact with the memory pad PA of the memory channel structure MCS. The bit line contacts BC may include a conductive material.

The third insulating layer 150 may be provided to cover the second insulating layer 140 and the bit line contacts BC. The third insulating layer 150 may include an insulating material.

The bit lines 300 may be provided in the third insulating layer 150. The bit lines 300 may extend in the first direction D1. The bit lines 300 may be spaced apart from each other in the second direction D2. The bit line 300 may be electrically connected to the memory channel structure MCS through the bit line contact BC. The bit line 300 may include a conductive material.

The conductive line 191 may be provided in the third insulating layer 150. The conductive line 191 may be electrically connected to the through-plug 331.

Figure 7:
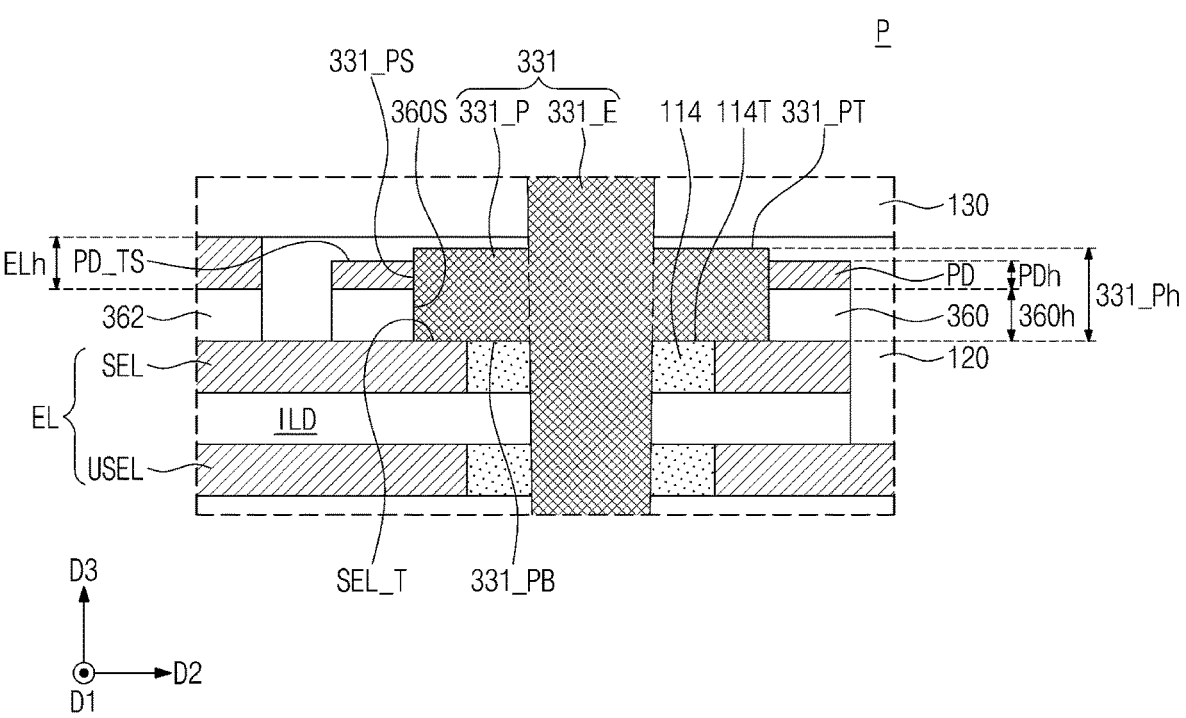
FIG. 7 is an enlarged view illustrating a portion 'P' of the example 3D semiconductor memory device shown in FIG. 6.

FIG. 7 is an enlarged view illustrating a portion 'P' of FIG. 6.

Referring to FIG. 7, the conductive patterns EL may include a selection conductive line SEL and a non-selection conductive line USEL. The through-plug 331 may be in contact with a corresponding one of the conductive patterns EL. The conductive pattern EL being in contact with the through-plug 331 may be defined as the selection conductive line SEL. The conductive pattern EL disposed directly under the pad insulating pattern 360 may be defined as the selection conductive line SEL.

In some embodiments, the conductive patterns EL may include the selection conductive line SEL and the non-selection conductive line USEL under the selection conductive line SEL. In certain embodiments, in a case in which another through-plug 331 not in contact with the selection conductive line SEL is in contact with the non-selection conductive line USEL, the non-selection conductive line USEL may be a selection conductive line with respect to the other through-plug 331.

The through-plug 331 may include a parallel plug portion 331_P and an extension plug portion 331_E. The extension plug portion 331_E may extend in the third direction D3 perpendicular to a top surface of the source structure SOT. The parallel plug portion 331_P may extend in the second direction D2 which is parallel to the top surface of the source structure SOT and intersects the first direction D1.

The plug insulating pattern 114 may be disposed between the extension plug portion 331_E and the conductive pattern EL. The parallel plug portion 331_P may be in contact with the selection conductive line SEL. The extension plug portion 331_E may not be in contact with the conductive pattern EL.

A bottom surface 331_PB of the parallel plug portion 331_P may be in contact with a top surface 114T of the plug insulating pattern 114 and a top surface SEL_T of the selection conductive line SEL. A side surface 331_PS of the parallel plug portion 331_P may be in contact with a side surface of the pad PD, a side surface 360S of the pad insulating pattern 360, and the gate insulating layer 120. The bottom surface 331_PB of the parallel plug portion 331_P may be coplanar with the top surface 114T of the plug insulating pattern 114 and the top surface SEL_T of the selection conductive line SEL. The side surface 331_PS of the parallel plug portion 331_P may be coplanar with the side surface of the pad PD and the side surface 360S of the pad insulating pattern 360.

The pad insulating pattern 360 may be spaced apart from the adjacent insulating pattern 362 in the second direction D2. A level of a top surface of the pad insulating pattern 360 may be the same as a level of a top surface of the adjacent insulating pattern 362 (i.e., coplanar). A height (i.e., cross-sectional thickness) of the adjacent insulating pattern 362, in the third direction D3, may be equal to a height of the pad insulating pattern 360.

The pad insulating pattern 360 may be disposed between the pad PD and the selection conductive line SEL. The pad insulating pattern 360 and the insulating pattern ILD may be spaced apart from each other in the third direction D3. The pad PD may be electrically floating.

A sum of a height PDh of the pad PD and a height 360h of the pad insulating pattern 360, in the third direction D3, may be less than a height 331_Ph of the parallel plug portion 331_P. The height PDh of the pad PD may be less than a height ELh of the conductive pattern EL in the third direction D3. The height PDh of the pad PD may be less than the height 360h of the pad insulating pattern 360. The height 331_Ph of the parallel plug portion 331_P may be greater than the height 360h of the pad insulating pattern 360.

A height of a top surface PD_TS of the pad PD relative to the top surface SEL_T of the selection conductive line SEL in the third direction D3 may be lower than a height of a top surface 331_PT of the parallel plug portion 331_P relative to the top surface SEL_T of the selection conductive line SEL. A level of the bottom surface 331_PB of the parallel plug portion 331_P may be the same as a level of the top surface SEL_T of the selection conductive line SEL in the third direction D3; that is, the bottom surface 331_PB of the parallel plug portion 331_P may be coplanar with the top surface SEL_T of the selection conductive line SEL. The level of the bottom surface 331_PB of the parallel plug portion 331_P may be the same as a level of the top surface 114T of the plug insulating pattern 114.

Figure 8:
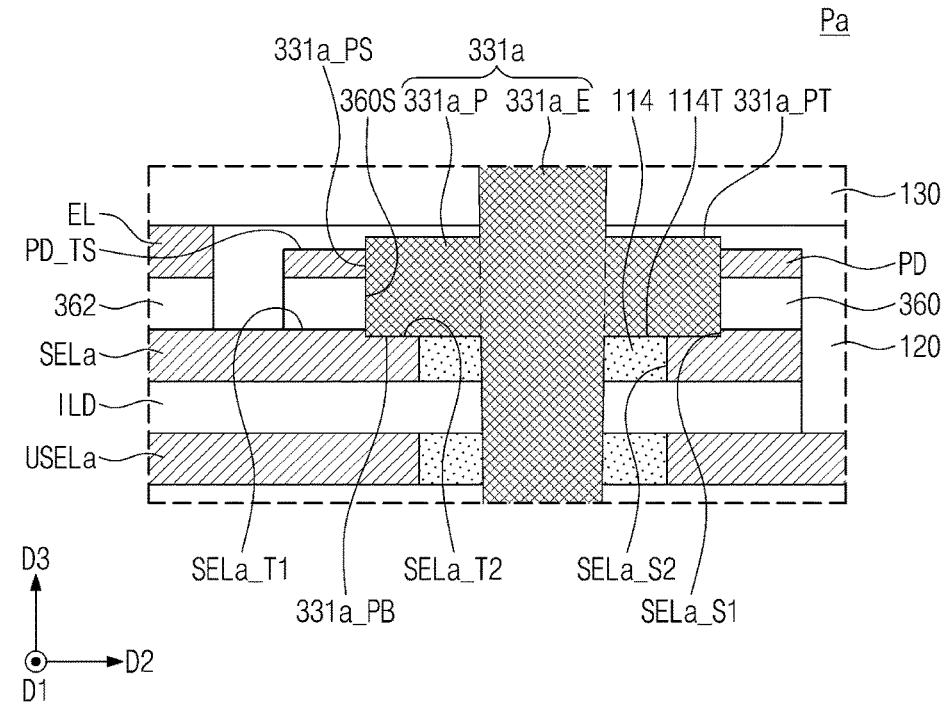
FIG. 8 is an enlarged view corresponding to the portion 'P' of FIG. 6 to illustrate a 3D semiconductor memory device according to some embodiments of the inventive concepts.

FIG. 8 is an enlarged view corresponding to the portion 'P' of FIG. 6 to illustrate a 3D semiconductor memory device according to some embodiments of the inventive concepts. Hereinafter, the descriptions of the same features and components as mentioned with reference to FIGS. 5, 6 and 7 will be omitted for the purpose of ease and convenience in explanation.

Referring to FIG. 8, a parallel plug portion 331a_P of a through-plug 331a may be in contact with the plug insulating pattern 114, a selection conductive line SELa, the pad PD, and the pad insulating pattern 360.

A first top surface SELa_T1 of the selection conductive line SELa may be in contact with the pad insulating pattern 360. A second top surface SELa_T2 of the selection conductive line SELa may be in contact with the parallel plug portion 331a_P. A first side surface SELa_S1 of the selection conductive line SELa may be in contact with a side surface 331a_PS of the parallel plug portion 331a_P.

The side surface 331a_PS of the parallel plug portion 331a_P may be in contact with the side surface of the pad PD, the side surface 360S of the pad insulating pattern 360, the gate insulating layer 120, and the selection conductive line SELa. A bottom surface 331a_PB of the parallel plug portion 331a_P may be in contact with the top surface 114T of the plug insulating pattern 114.

A height of the top surface 114T of the plug insulating pattern 114 in the third direction D3, relative to an upper surface of the insulating pattern ILD, may be lower than a height of the first top surface SELa_T1 of the selection conductive line SELa. A level of the bottom surface 331a_PB of the parallel plug portion 331a_P may be lower than the level of the first top surface SELa_T1 of the selection conductive line SELa in the third direction D3, relative to the upper surface of the insulating pattern ILD. The level of the bottom surface 331a_PB of the parallel plug portion 331a_P may be the same as (i.e., coplanar with) a level of the second top surface SELa_T2 of the selection conductive line SELa in the third direction D3, relative to the upper surface of the insulating pattern ILD.

The level of the first top surface SELa_T1 of the selection conductive line SELa may be different from the level of the second top surface SELa_T2 in the third direction D3, relative to the upper surface of the insulating pattern ILD. The selection conductive line SELa may include a stepped shape.

Figure 9:
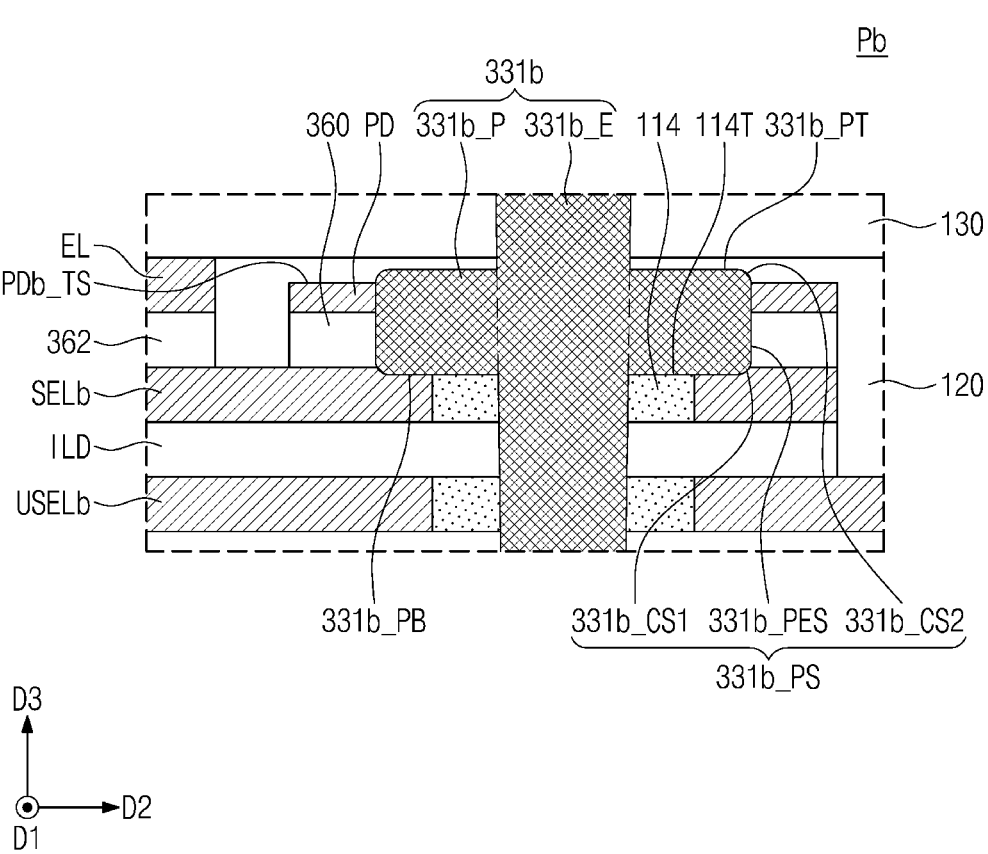
FIG. 9 is an enlarged view corresponding to the portion 'P' of FIG. 6 to illustrate a 3D semiconductor memory device according to some embodiments of the inventive concepts.

FIG. 9 is an enlarged view corresponding to the portion 'P' of FIG. 6 to illustrate a 3D semiconductor memory device according to some embodiments of the inventive concepts. Hereinafter, the descriptions of the same features and components as mentioned with reference to FIGS. 5, 6 and 7 will be omitted for the purpose of ease and convenience in explanation.

Referring to FIG. 9, a parallel plug portion 331b_P of a through-plug 331b may be in contact with the plug insulating pattern 114, a selection conductive line SELb, the pad PD, and the pad insulating pattern 360.

A contact surface of the parallel plug portion 331b_P and the selection conductive line SELb may include a curved surface. A side surface 331b_PS of the parallel plug portion 331b_P may include a first curved surface 331b_CS1, a connection side surface 331b_PES, and a second curved surface 331b_CS2. The first curved surface 331b_CS1, the connection side surface 331b_PES and the second curved surface 331b_CS2 may be connected to each other.

The first curved surface 331b_CS1 of the parallel plug portion 331b_P may be connected to a bottom surface 331b_PB of the parallel plug portion 331b_P. The second curved surface 331b_CS2 of the parallel plug portion 331b_P may be connected to a top surface 331b_PT of the parallel plug portion 331b_P. The bottom surface 331b_PB of the parallel plug portion 331b_P, which extends from the first curved surface 331b_CS1 of the parallel plug portion 331b_P, may be in contact with the selection conductive line SELb.

The first curved surface 331b_CS1 of the parallel plug portion 331b_P may be in contact with the selection conductive line SELb. The connection side surface 331b_PES of the parallel plug portion 331b_P may be in contact with the pad PD and the pad insulating pattern 360. The second curved surface 331b_CS2 of the parallel plug portion 331b_P may be in contact with the gate insulating layer 120.

FIGS. 10 to 12, 14, 16, 18, 20, 22, 24, 26, 28, 30 and 32 are cross-sectional views corresponding to the line A-A' of FIG. 5 to illustrate intermediate processing in an example method of manufacturing a 3D semiconductor memory device, according to some embodiments of the inventive concepts. FIGS. 13, 15, 17, 19, 21, 23, 25, 27, 29, 31 and 33 are cross-sectional views corresponding to the portion 'P' of FIG. 6 to illustrate intermediate processing in an example method of manufacturing a 3D semiconductor memory device, according to some embodiments of the inventive concepts. Hereinafter, the descriptions of the same features as mentioned with reference to FIGS. 5, 6 and 7 will be omitted for the purpose of ease and convenience in explanation.

Figure 10:
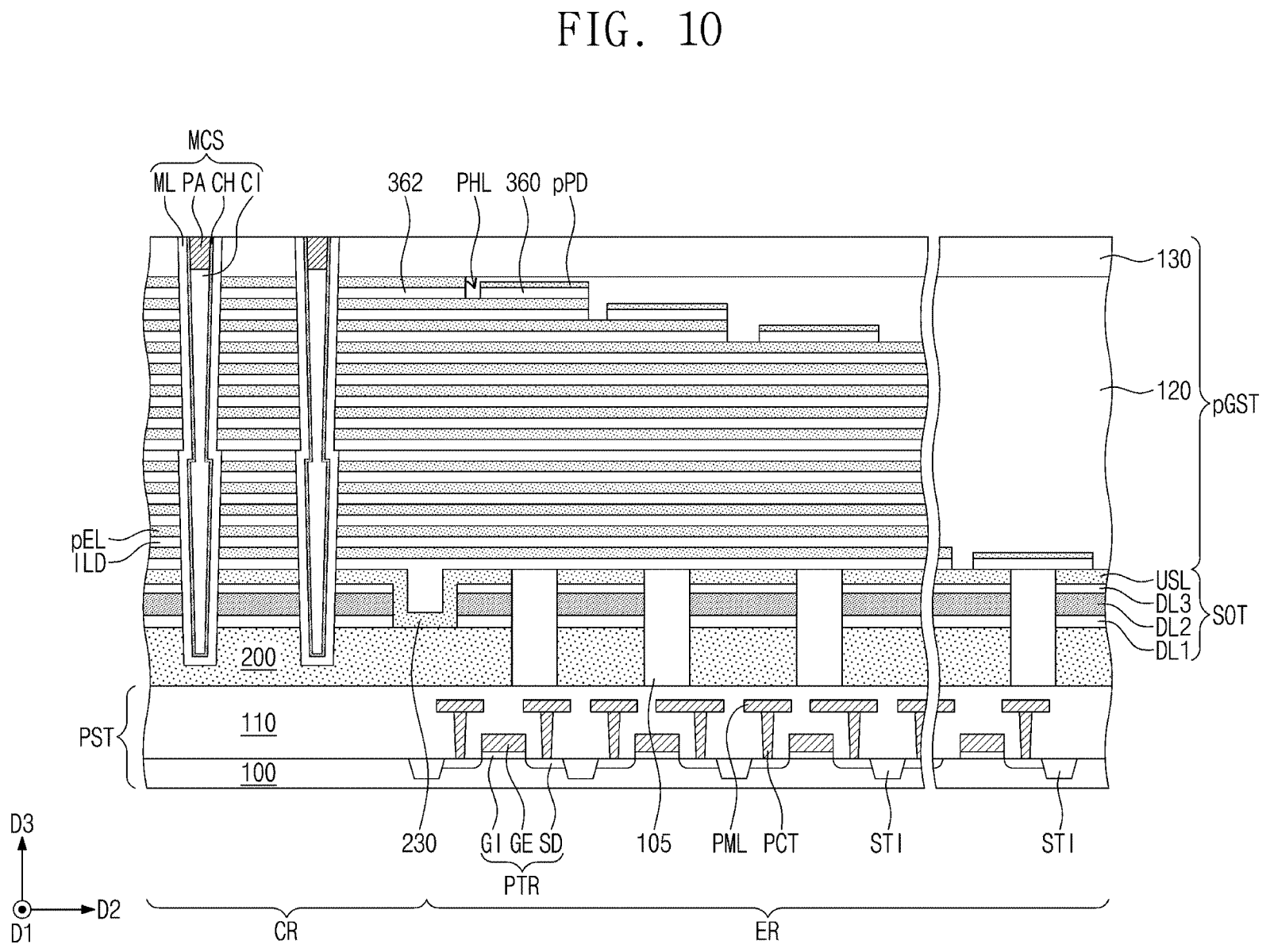

Referring to FIG. 10, a peripheral circuit structure PST including a cell region CR and an extension region ER may be provided. The peripheral circuit structure PST may include a substrate 100 and a peripheral insulating layer 100 on an upper surface of the substrate 100. The formation of the peripheral circuit structure PST may include forming a device isolation layer STI (e.g., shallow trench isolation (STI) structures) defining peripheral active regions in the substrate 100, forming peripheral transistors PTR on and/or in the peripheral active regions, and forming peripheral contacts PCT and peripheral interconnection lines PML which are electrically connected to the peripheral transistors PTR. The peripheral insulating layer 110 may cover the peripheral transistors PTR, the peripheral contacts PCT and the peripheral interconnection lines PML on the substrate 100.

A semiconductor layer 200 may be formed on the peripheral circuit structure PST.

A source structure SOT may be formed on the semiconductor layer 200. The source structure SOT may include a first dummy layer DL1, a second dummy layer DL2, a third dummy layer DL3 and an upper source layer USL, which are sequentially stacked in the third direction D3. The first to third dummy layers DL1, DL2 and DL3 and the upper source layer USL of the source structure SOT may extend from the cell region CR into the extension region ER in the second direction D2. A source separation portion 230 of the source structure SOT may be formed between the cell region CR and the extension region ER. A plug insulating layer 105, extending in the third direction D3, may be formed to penetrate the semiconductor layer 200 and the source structure SOT. For example, a trench may be formed to penetrate the semiconductor layer 200 and the source structure SOT, and then, the trench penetrating the semiconductor layer 200 and the source structure SOT may be filled with an insulating material to form the plug insulating layer 105.

A preliminary gate stack structure pGST, memory channel structures MCS and support structures may be formed on the semiconductor layer 200. The formation of the preliminary gate stack structure pGST may include alternately stacking preliminary conductive patterns pEL and insulating patterns ILD on the source structure SOT, patterning the preliminary conductive patterns pEL and the insulating patterns ILD on the extension region ER to have a staircase shape, forming a pad hole PHL in the preliminary conductive pattern pEL and the insulating pattern ILD, a preliminary pad pPD and a pad insulating pattern 360, forming a gate insulating layer 120, and forming a first insulating layer 130.

In some embodiments, the pad hole PHL may be formed in an uppermost preliminary conductive pattern pEL and an uppermost insulating pattern ILD of the preliminary conductive patterns pEL and the insulating patterns ILD stacked in the staircase shape, and a top end portion of the uppermost preliminary conductive pattern pEL may be etched to form the preliminary pad pPD. A cross-sectional thickness of the preliminary pad pPD, taken in the direction D3 (i.e., vertically) may be less than a cross-sectional thickness of the preliminary conductive pattern pEL. The pad insulating pattern 360 may be spaced apart from the uppermost insulating pattern ILD by the pad hole PHL and may be formed under the preliminary pad pPD.

The memory channel structures MCS may be formed after the formation of the preliminary gate stack structure pGST. The formation of the memory channel structures MCS may include forming channel holes penetrating the preliminary gate stack structure pGST in the third direction D3 to expose side surfaces of the preliminary conductive patterns pEL, side surfaces of the insulating patterns ILD, side surfaces of the upper source layer USL, side surfaces of the first to third dummy layers DL1, DL2 and DL3 and the semiconductor layer 200, and forming a memory layer ML, a channel layer CH and a core insulating layer CI in each of the channel holes. A memory pad PA may be formed on the core insulating layer CI.

Figure 11:
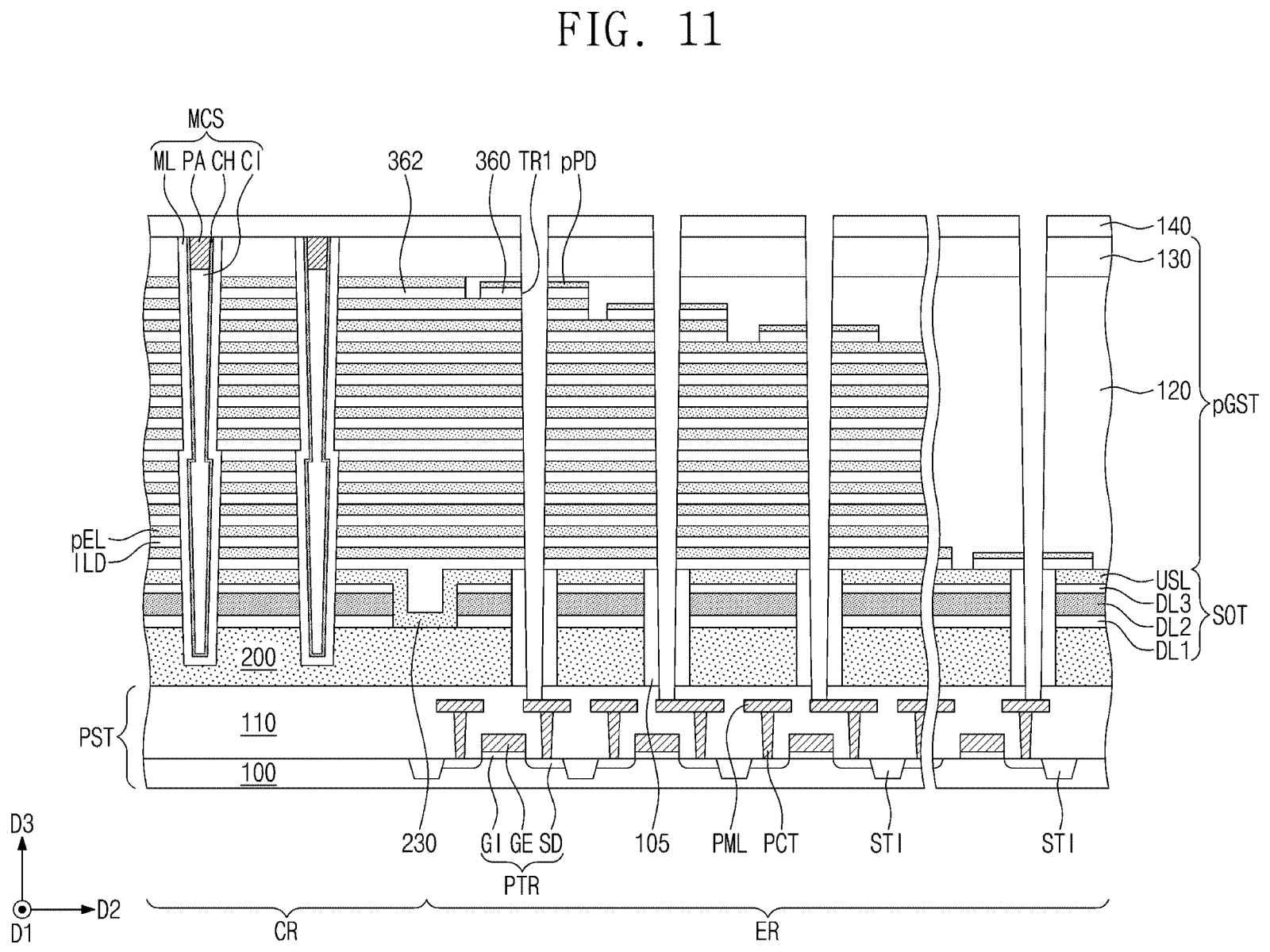

Referring to FIG. 11, a second insulating layer 140 may be formed on the preliminary gate stack structure pGST. A first trench TR1 may be formed to penetrate the second insulating layer 140, the preliminary gate stack structure pGST, and the source structure SOT. The first trench TR1 may expose the preliminary pad pPD, the pad insulating pattern 360, side surfaces of the preliminary conductive patterns pEL, side surfaces of the insulating patterns ILD, a side surface of the plug insulating layer 105, and the peripheral insulating layer 110. The first trench TR1 may expose a corresponding one of the peripheral interconnection lines PML. For example, the formation of the first trench TR1 may include forming a mask layer defining a region, in which the first trench TR1 will be formed, on the second insulating layer 140, and anisotropically etching the second insulating layer 140, the first insulating layer 130, the gate insulating layer 120, the preliminary conductive patterns pEL, the insulating patterns ILD, the plug insulating layer 105 and the peripheral insulating layer 110 by using the mask layer as an etch mask.

Figure 12:
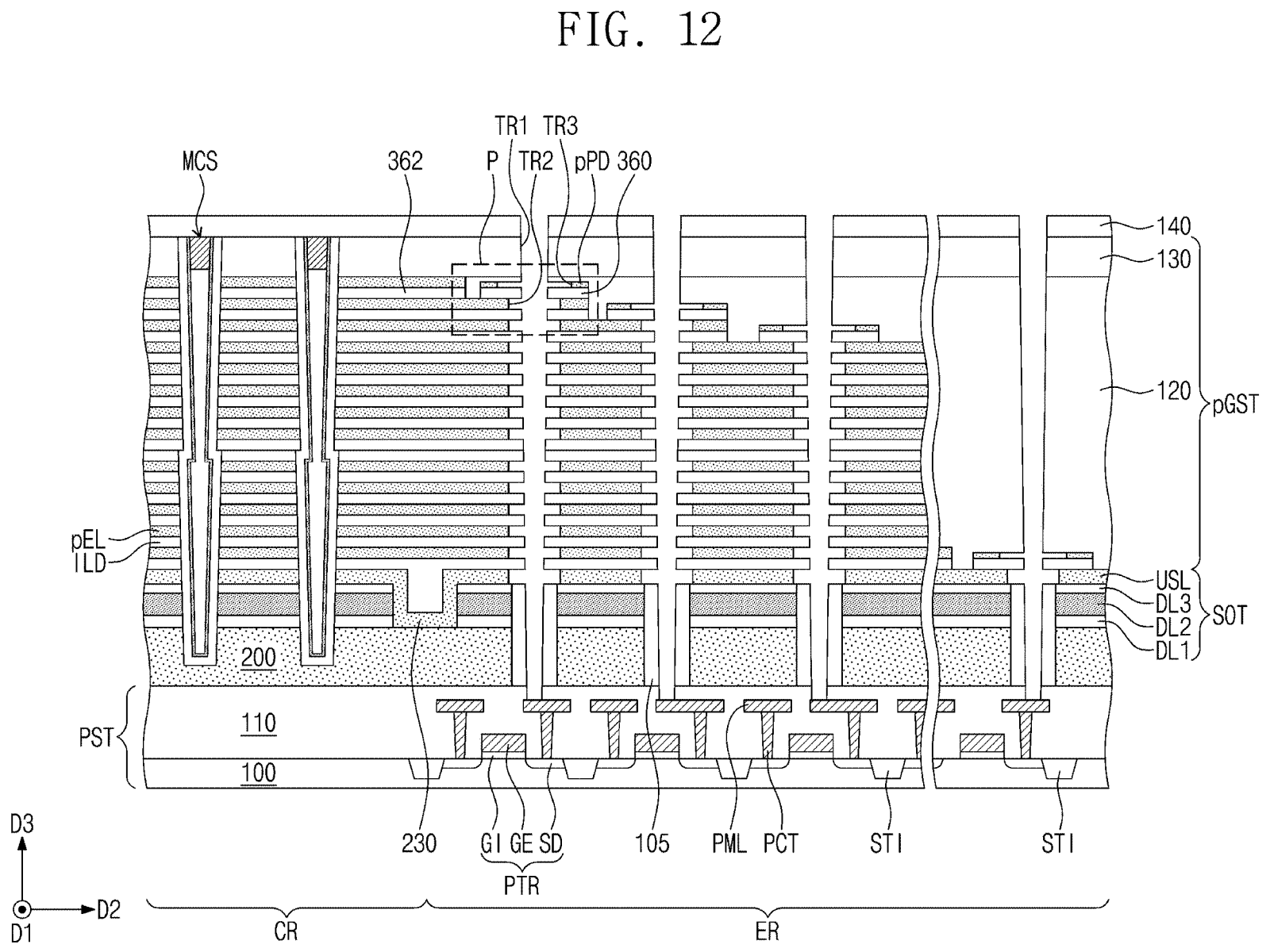
Figure 13:
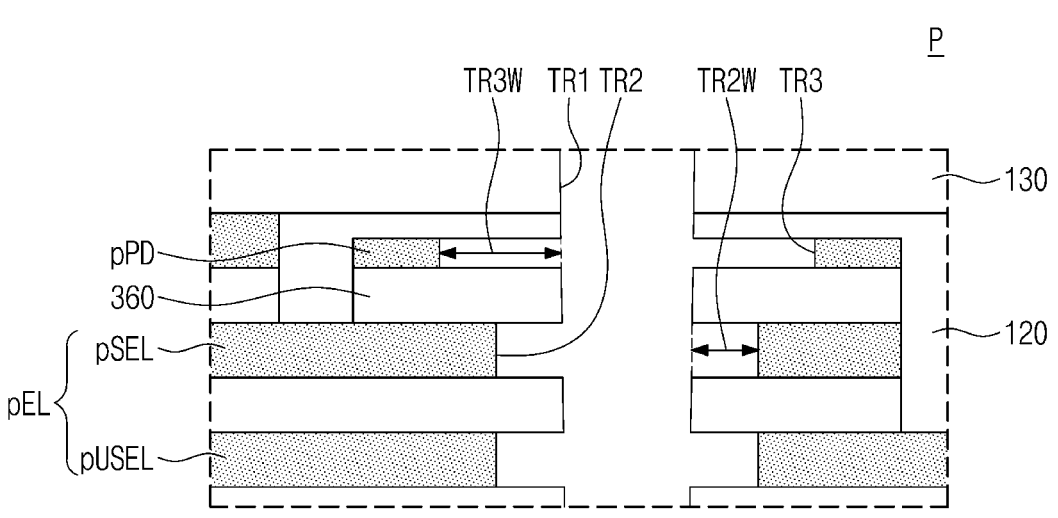
FIGS. 13, 15, 17, 19, 21, 23, 25, 27, 29, 31 and 33 are cross-sectional views corresponding to the portion 'P' of FIG. 6 to illustrate intermediate processing in an example method of manufacturing a 3D semiconductor memory device, according to some embodiments of the inventive concepts.

Referring to FIGS. 12 and 13, portions of the preliminary conductive patterns pEL may be removed through the first trench TR1, and thus second trenches TR2 may be formed. For example, the formation of the second trenches TR2 may include removing the portions of the preliminary conductive patterns pEL by an etching process. The second trench TR2 may be formed in an end portion of the preliminary conductive pattern pEL, which is exposed by the first trench TR1. Remaining portions of the preliminary conductive patterns pEL may remain between the insulating patterns ILD, and inner side surfaces of the remaining portions of the preliminary conductive patterns pEL may be exposed by the second trenches TR2. Inner side surfaces of a preliminary selection line pSEL and a preliminary non-selection line pUSEL of the preliminary conductive patterns pEL may be exposed by the second trenches TR2.

The first trench TR1 may be connected to the second trench TR2. The second trench TR2 may laterally or horizontally extend from the first trench TR1 (e.g., in the first direction D1 and the second direction D2).

A portion of the preliminary pad pPD may be removed through the first trench TR1, and thus a third trench TR3 may be formed. For example, the formation of the third trench TR3 may include removing the portion of the preliminary pad pPD by an etching process. The third trench TR3 may be formed in an end portion of the preliminary pad pPD, which is exposed by the first trench TR1. A remaining portion of the preliminary pad pPD may remain on the pad insulating pattern 360, and an inner side surface of the remaining portion of the preliminary pad pPD may be exposed by the third trench TR3. The first trench TR1 may be connected to the third trench TR3. The third trench TR3 may laterally or horizontally extend from the first trench TR1 (e.g., in the first direction D1 and the second direction D2).

The second trench TR2 and the third trench TR3 may be formed at the same time by the same etching process. The formation of the second trench TR2 and the third trench TR3 may include performing the etching process (e.g., a wet etching process) to remove the portion of the preliminary pad pPD and to recess the inner side surfaces of the insulating patterns ILD.

When the second trench TR2 and the third trench TR3 are formed, a width TR2W of the second trench TR2 may be less than a width TR3W of the third trench TR3.

Figure 14:
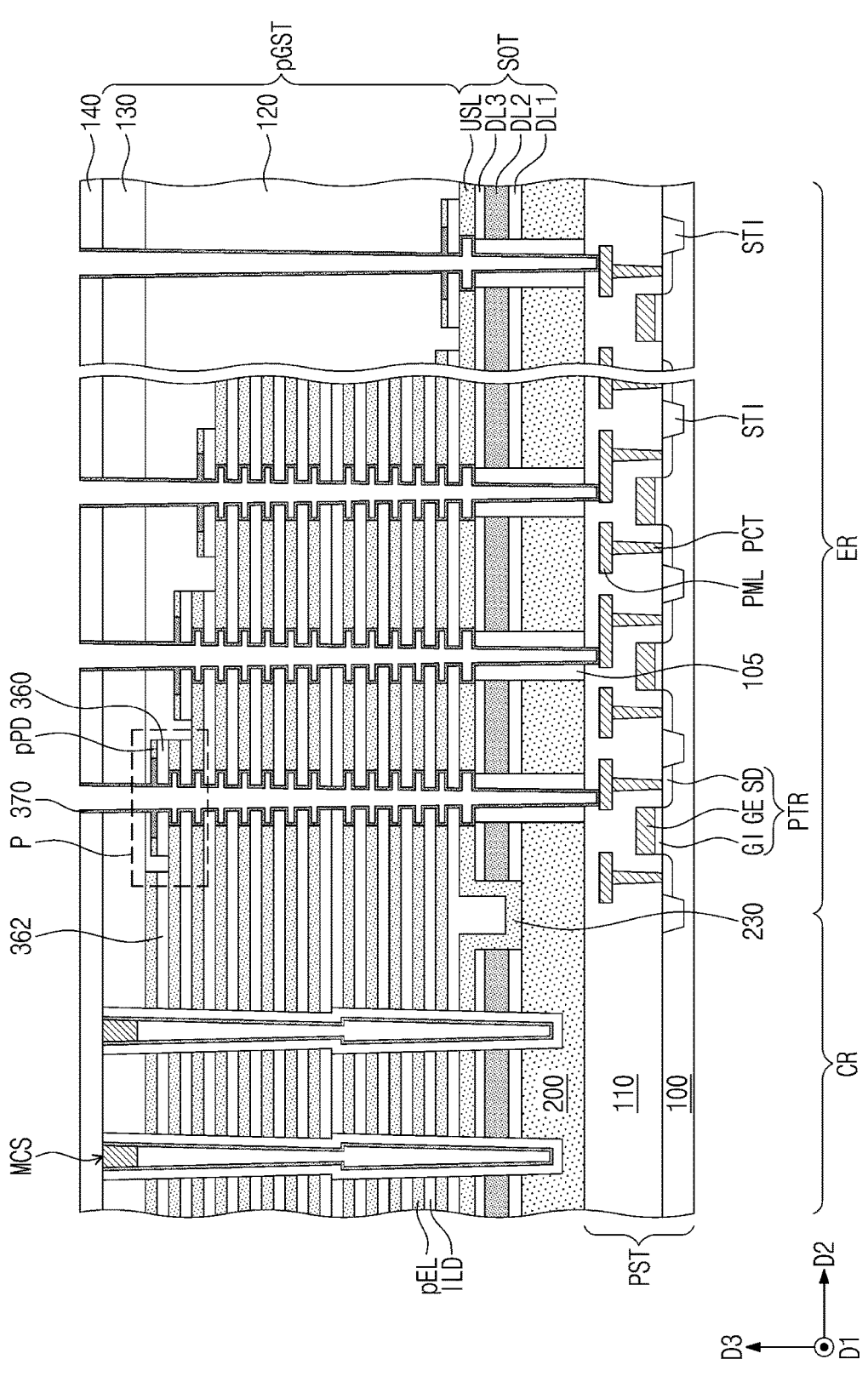
Figure 15:
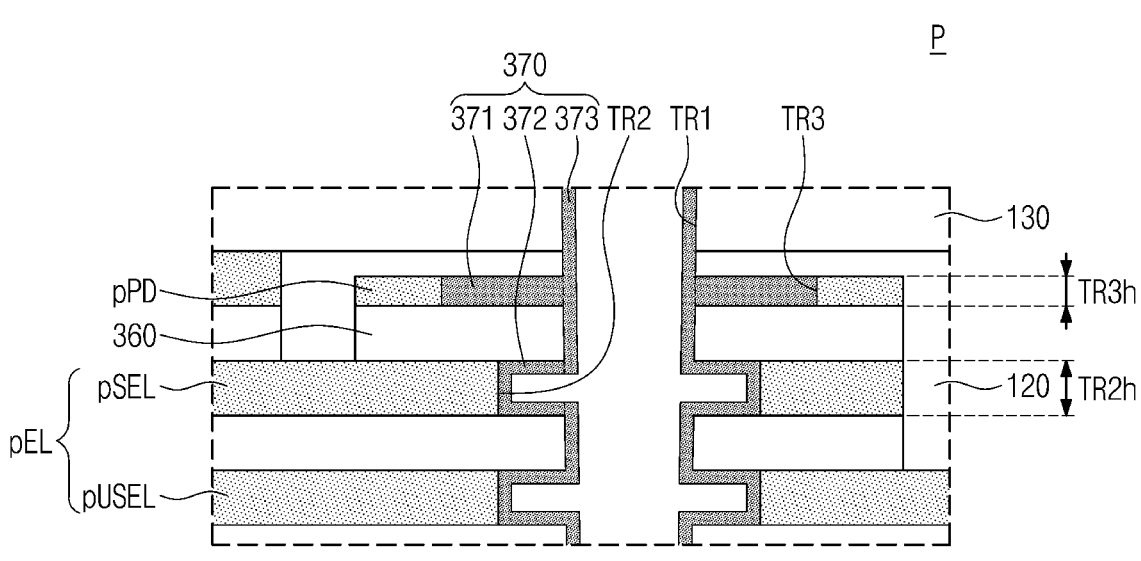

Referring to FIGS. 14 and 15, a blocking layer 370 may be formed to conformally cover inner surfaces of the first trench TR1 and the second trench TR2 and to fill the third trench TR3. A height TR3$h$ of the third trench TR3 in the third direction D3 may be less than a height TR2$h$ of the second trench TR2 in the third direction D3, and thus the blocking layer 370 may partially fill the second trench TR2 but may completely fill the third trench TR3. The blocking layer 370 may cover the side surfaces of the preliminary pad pPD, the preliminary selection line pSEL and the preliminary non-selection line pUSEL and the inner surface of the first trench TR1. The blocking layer 370 may include a first blocking portion 371 covering the side surface of the preliminary pad pPD, a second blocking portion 372 covering the side surface of the preliminary selection line pSEL, and a third blocking portion 373 covering the inner surface of the first trench TR1. For example, the blocking layer 370 may include TiN, although embodiments of the inventive concept are not limited to any specific material(s) forming the blocking layer 370.

Figure 16:
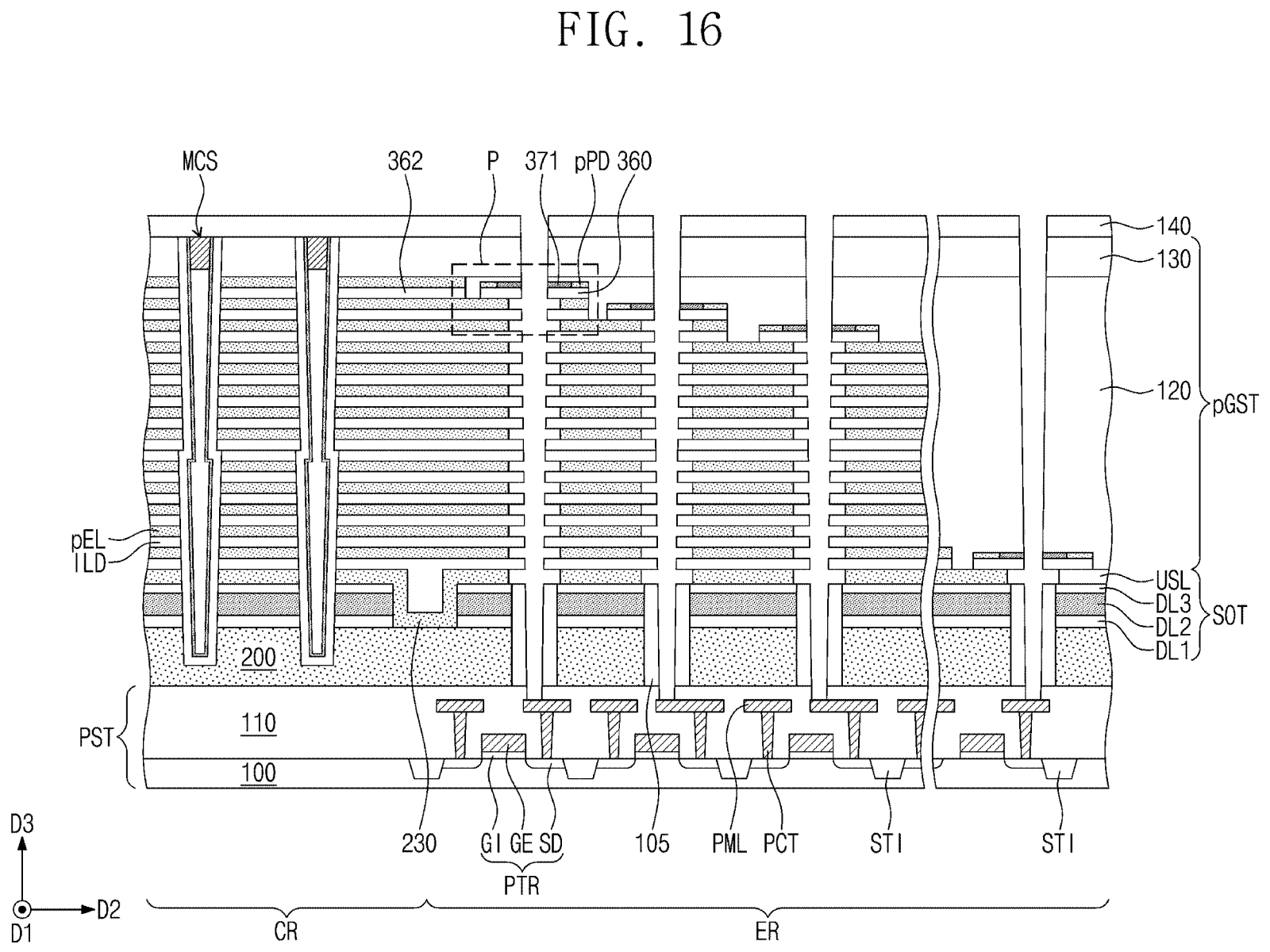
Figure 17:
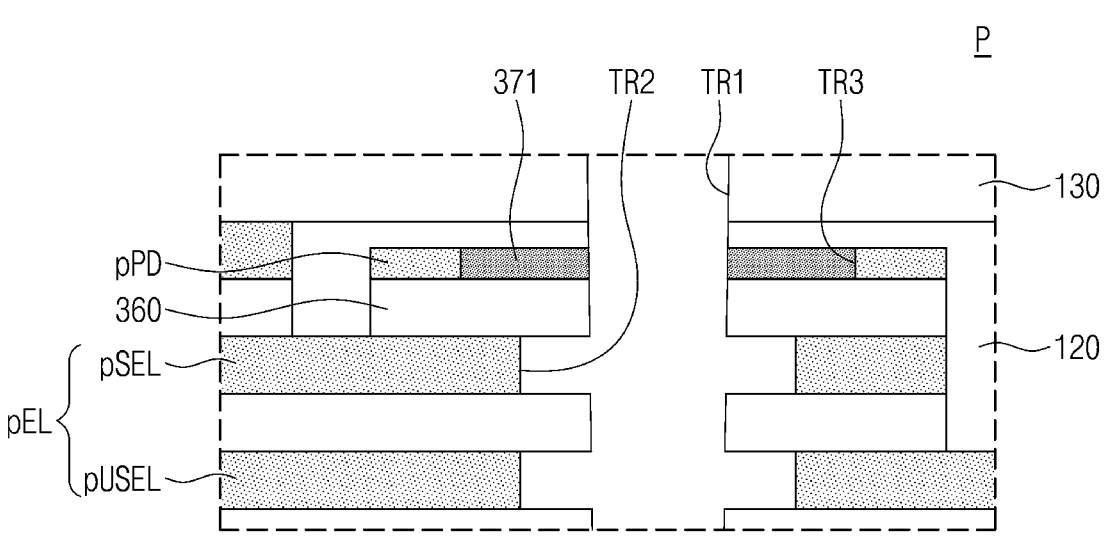

Referring to FIGS. 16 and 17, the second blocking portion 372 and the third blocking portion 373 may be removed (e.g., by selective etching). At this time, the first blocking portion 371 may remain. The side surface of the preliminary selection line pSEL and the side surface of the preliminary non-selection line pUSEL may be exposed by the removal of the second blocking portion 372 and the third blocking portion 373. The first trench TR1 and the second trench TR2 may be exposed by the removal of the second blocking portion 372 and the third blocking portion 373.

Figure 18:
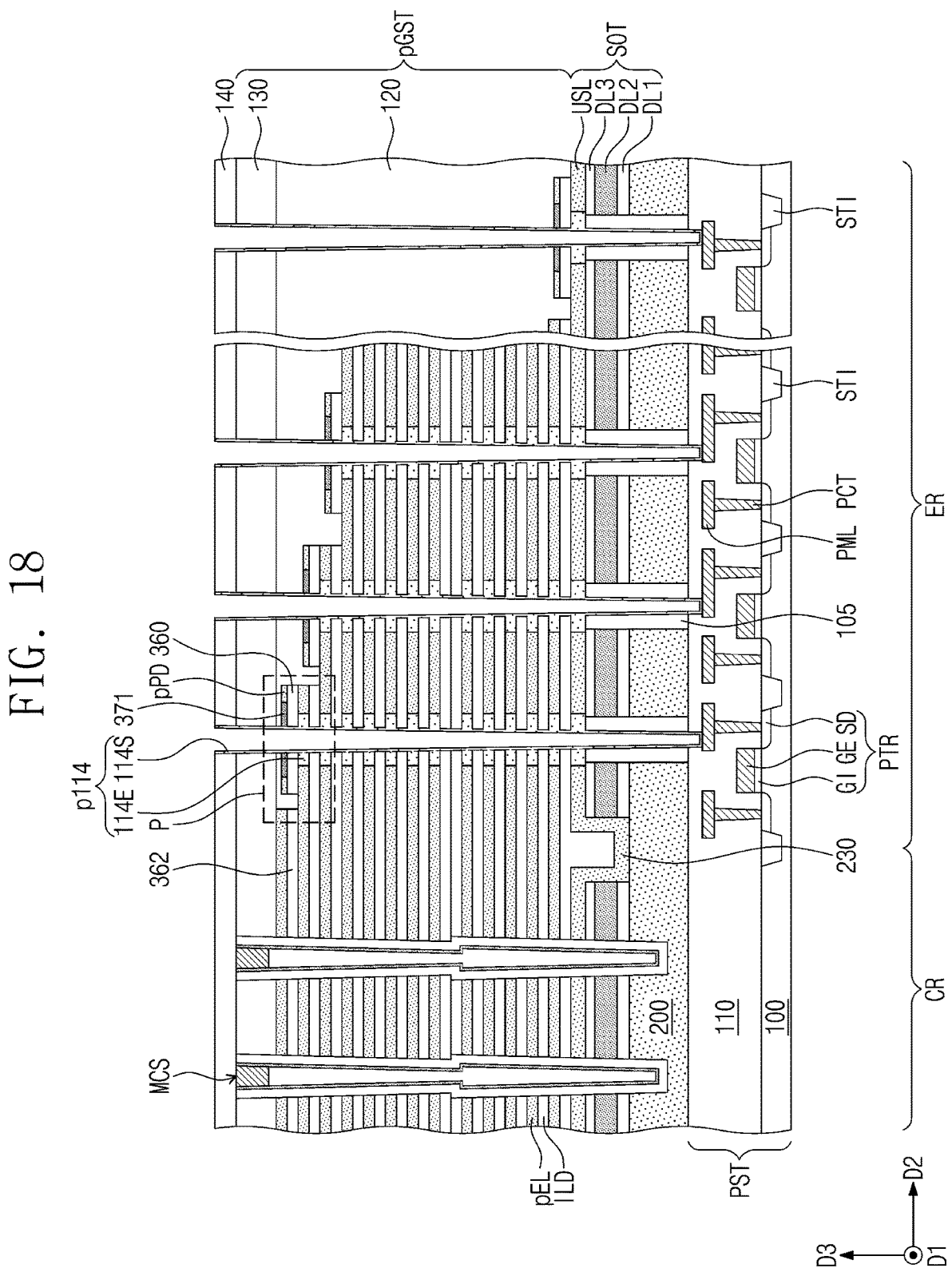
Figure 19:
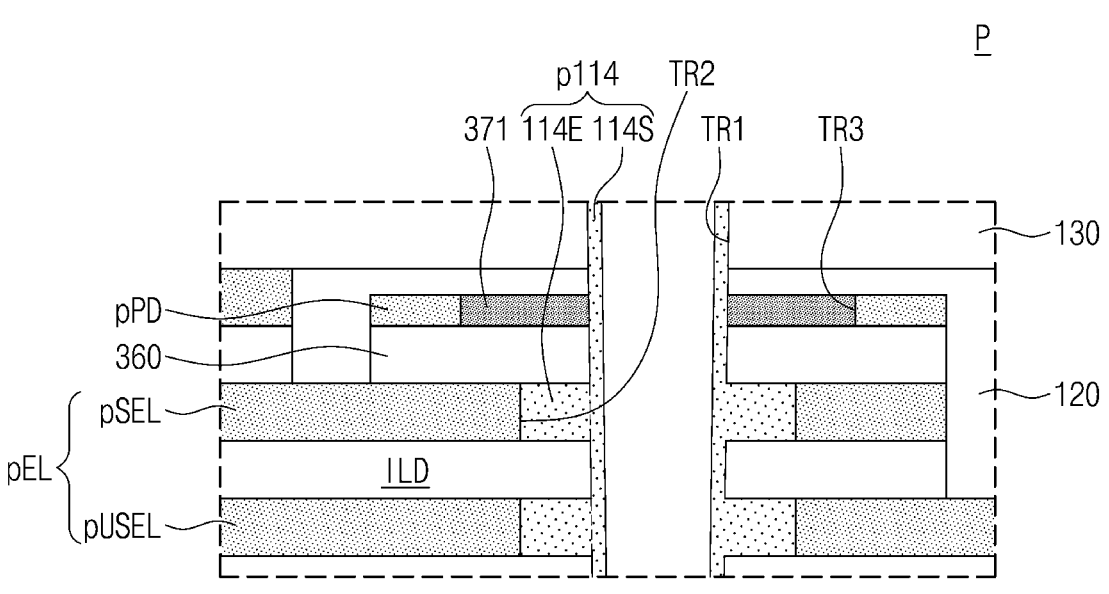

Referring to FIGS. 18 and 19, a preliminary plug insulating pattern p114 may be formed. The preliminary plug insulating pattern p114 may include a first preliminary plug insulating pattern 114E filling the second trench TR2, and a second preliminary plug insulating pattern 114S conformally covering the inner surface of the first trench TR1. The first preliminary plug insulating pattern 114E may be in contact with the inner side surface of the preliminary conductive pattern pEL. The preliminary plug insulating pattern p114 may include, for example, an oxide, although embodiments of the inventive concept are not limited thereto.

Figure 20:
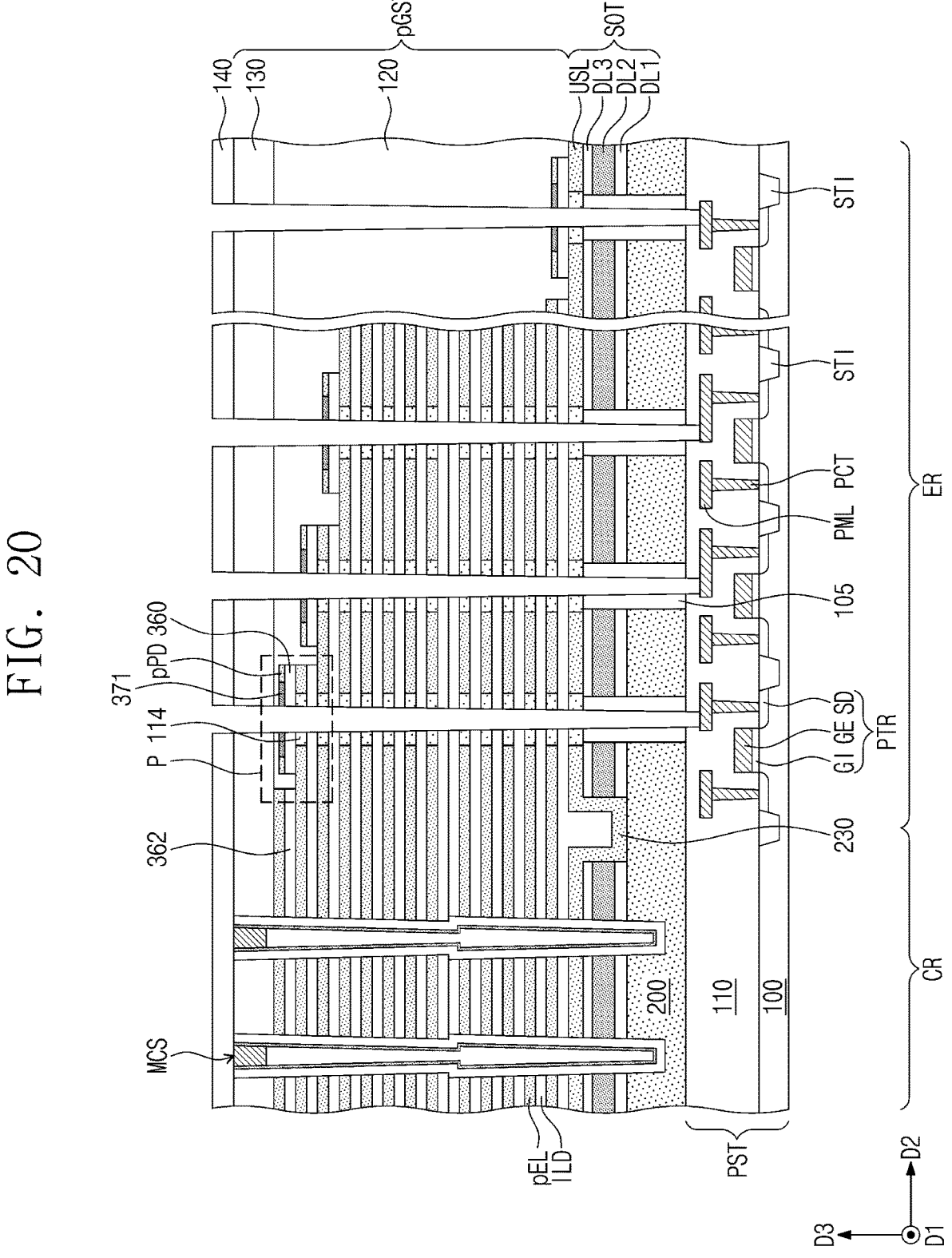
Figure 21:
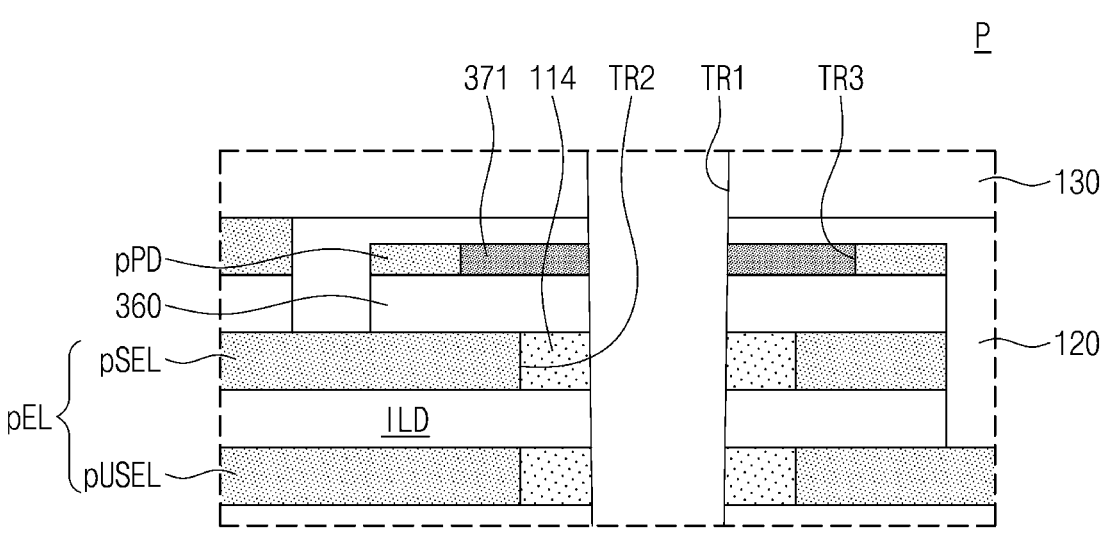

Referring to FIGS. 20 and 21, the second preliminary plug insulating pattern 114S of the preliminary plug insulating pattern p114 may be removed (e.g., by selective etching), and the first preliminary plug insulating pattern 114E may remain to form a plug insulating pattern 114. Thus, the inner surfaces of the first trench TR1 may be exposed.

Figure 22:
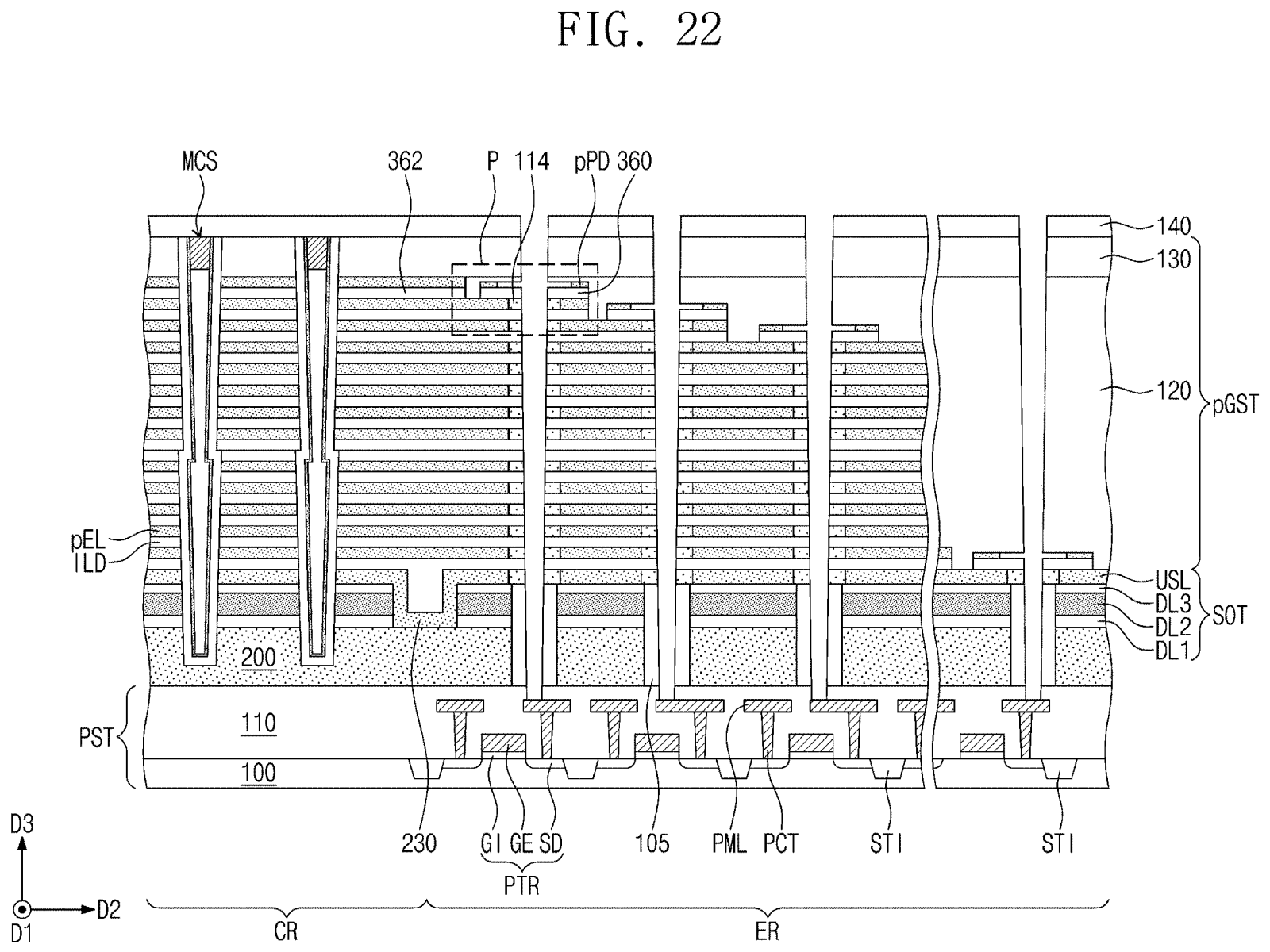
Figure 23:
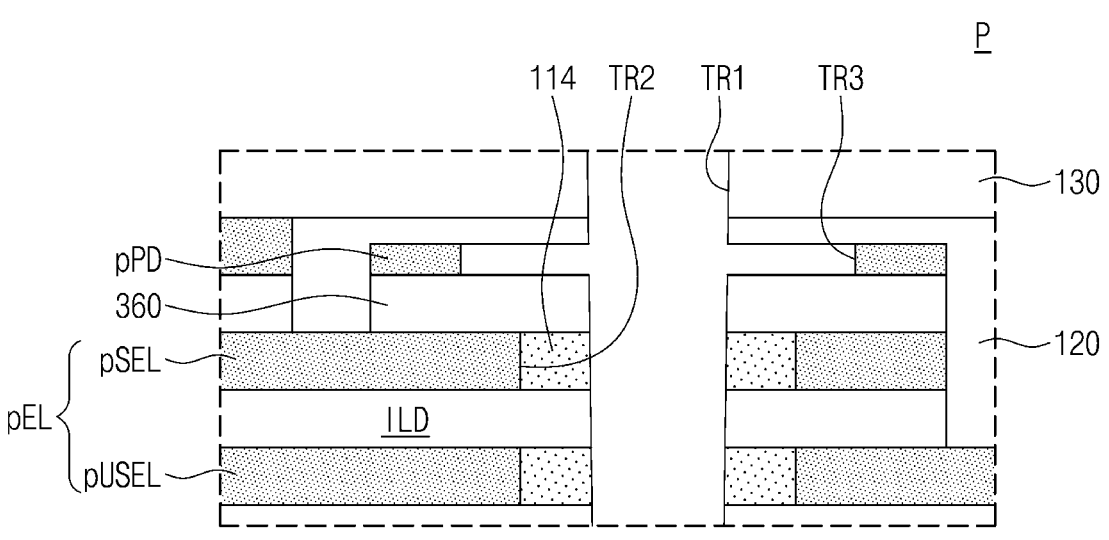

Referring to FIGS. 22 and 23, the first blocking portion 371 may be selectively removed (e.g., by selective etching). Thus, the inner surfaces of the third trench TR3 may be exposed. In addition, the inner side surface of the preliminary pad pPD may be exposed. The plug insulating pattern 114 may remain during the removal of the first blocking portion 371.

Figure 24:
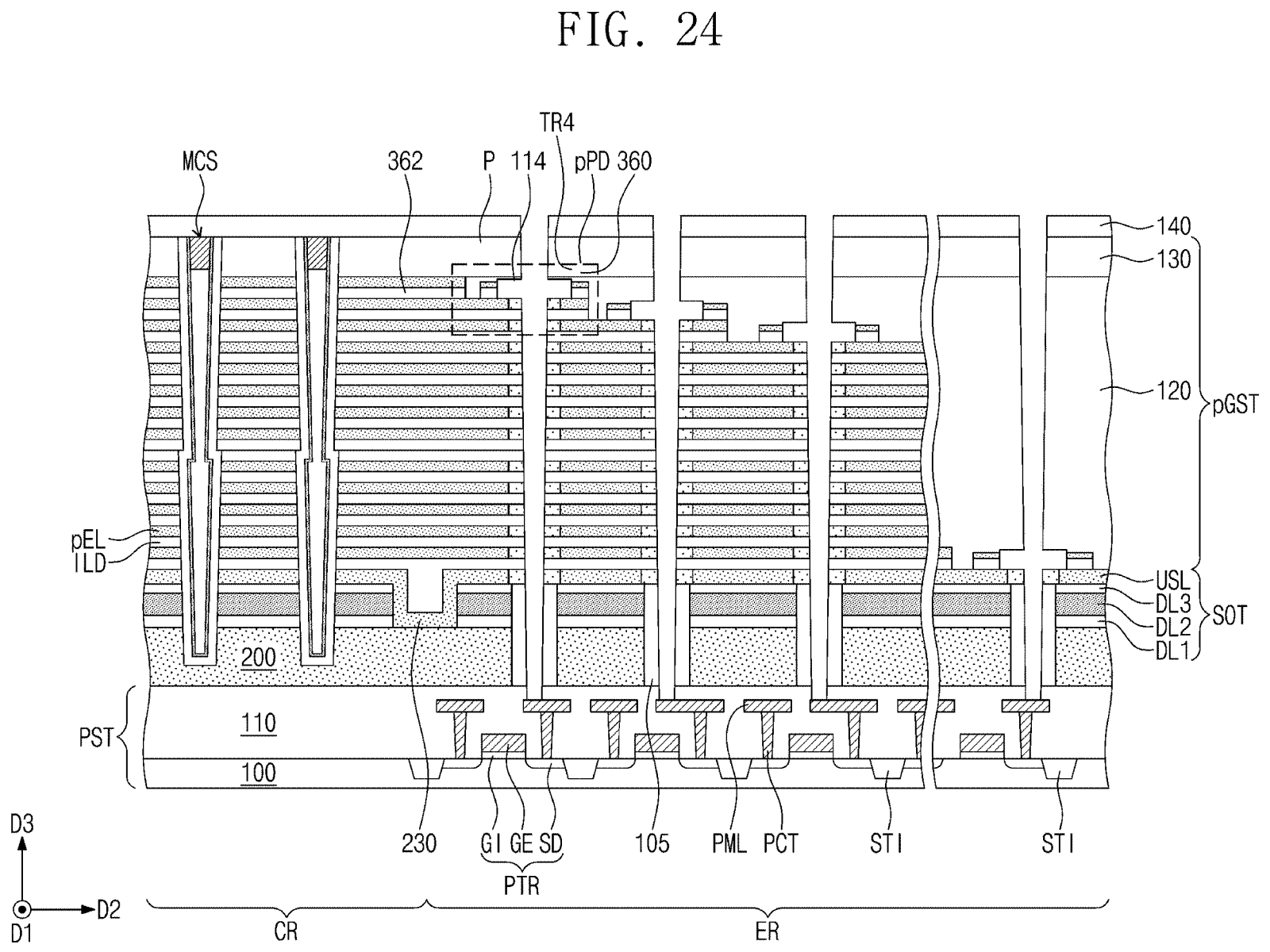
Figure 25:
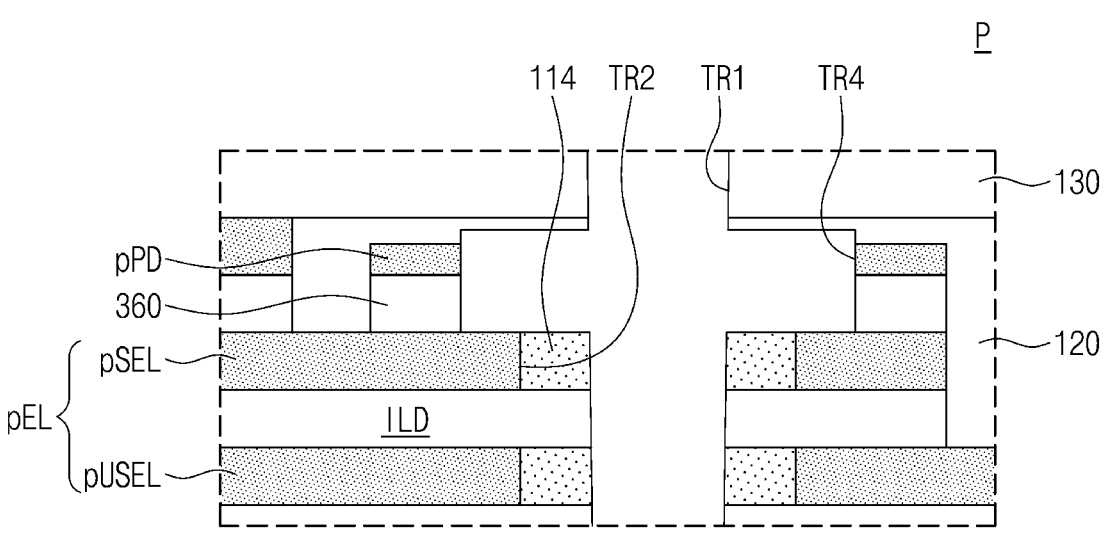

Referring to FIGS. 24 and 25, a fourth trench TR4 may be formed. The fourth trench TR4 may be formed to expose a side surface of the preliminary pad pPD, a side surface of the pad insulating pattern 360, a portion of a top surface of the preliminary selection line pSEL, and a top surface of the plug insulating pattern 114 located at the same level as (i.e., coplanar with) the preliminary selection line pSEL. A height of the fourth trench TR4 in the third direction D3 may be greater than a sum of a height of the preliminary pad pPD and a height of the pad insulating pattern 360. The first trench TR1 and the fourth trench TR4 may be connected to each other, with the fourth trench TR4 extending laterally from the first trench TR1 in the second direction D2.

Figure 26:
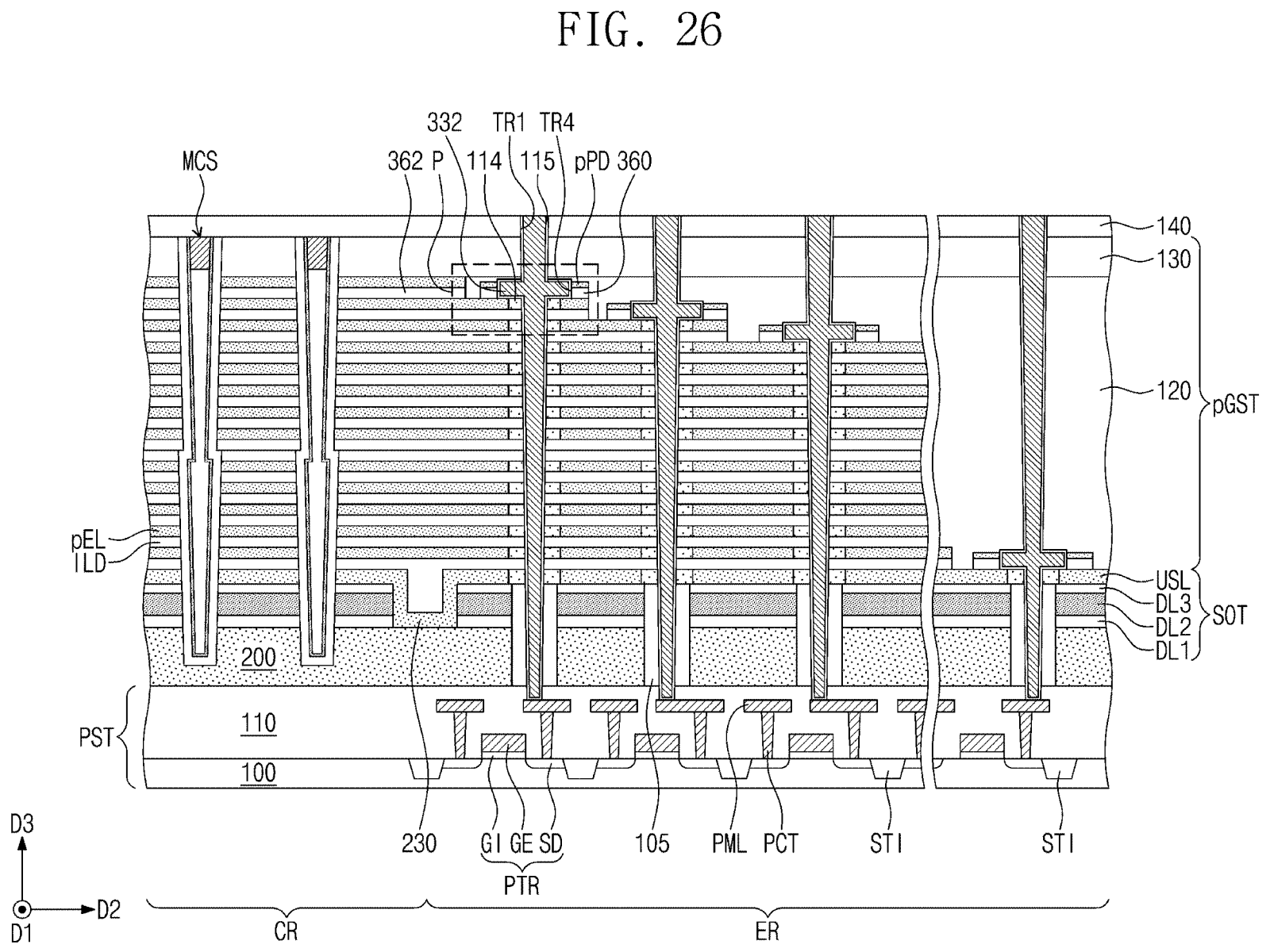
Figure 27:
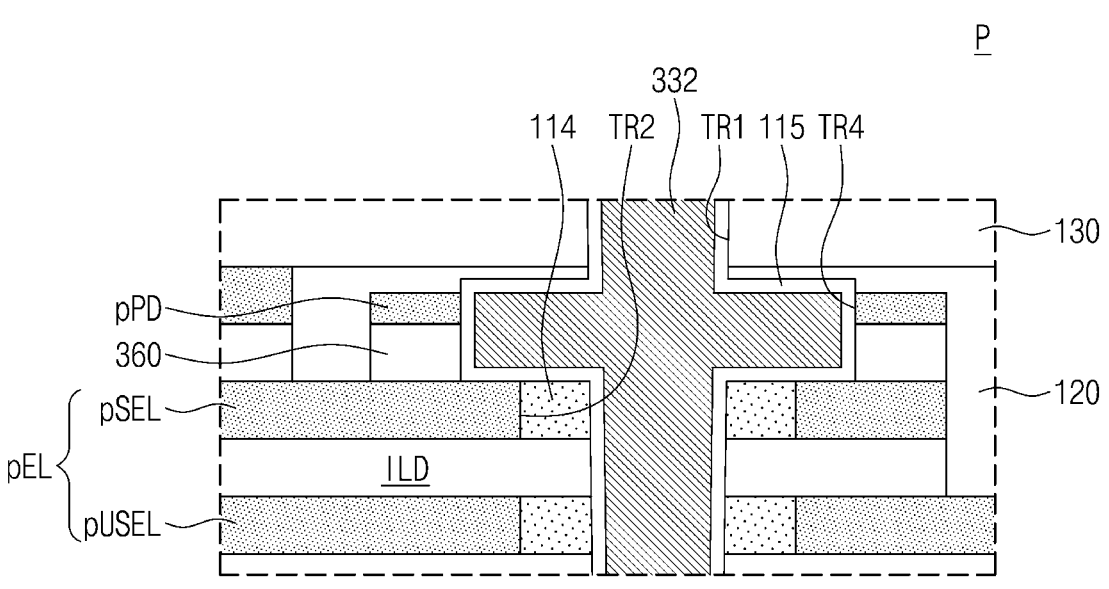

Referring to FIGS. 26 and 27, a plug sacrificial layer 115 and a preliminary through-plug 332 may be formed. The plug sacrificial layer 115 may be formed to conformally cover inner surfaces of the first trench TR1 and the fourth trench TR4. The plug sacrificial layer 115 may include multiple layers. For example, the plug sacrificial layer 115 may include a plug sacrificial layer including an oxide and a plug sacrificial layer including a nitride. For example, the plug sacrificial layer 115 may include silicon oxide. For example, the plug sacrificial layer 115 may include silicon nitride. It is to be appreciated that embodiments of the inventive concept are not limited to any specific material(s) forming the plug sacrificial layer 115.

The preliminary through-plug 332 may be formed to fill remaining portions of the first trench TR1 and the fourth trench TR4. For example, the preliminary through-plug 332 may include poly-silicon. The term "fill" (or similarly "filling," "filled," or the like) as may be used herein is intended to refer broadly to either completely filling a defined space (e.g., first trench TR1 and fourth trench TR4) or partially filling the defined space; that is, the defined space need not be entirely filled but may, for example, be partially filled or have voids or other spaces throughout.

For example, the formation of the plug sacrificial layer 115 and the preliminary through-plug 332 may include forming the plug sacrificial layer 115 on the second insulating layer 140 to conformally cover the inner surfaces of the first trench TR1 and the fourth trench TR4, forming the preliminary through-plug 332 filling remaining portions of the first trench TR1 and the fourth trench TR4, and planarizing the plug sacrificial layer 115 and the preliminary through-plug 332 to expose a top surface of the second insulating layer 140. For example, the planarization may be performed using a chemical mechanical polishing (CMP) process or an etch-back process.

Figure 28:
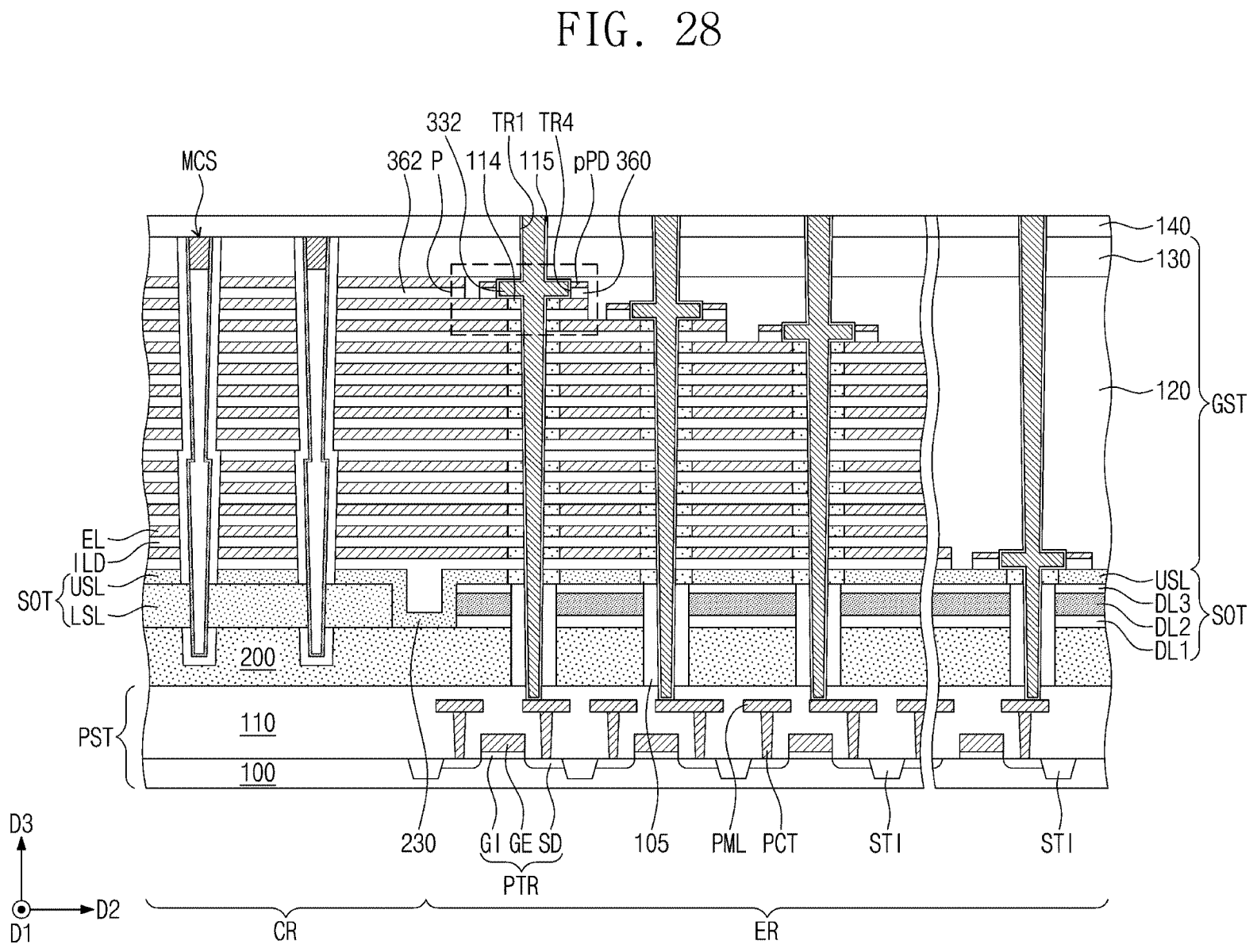
Figure 29:
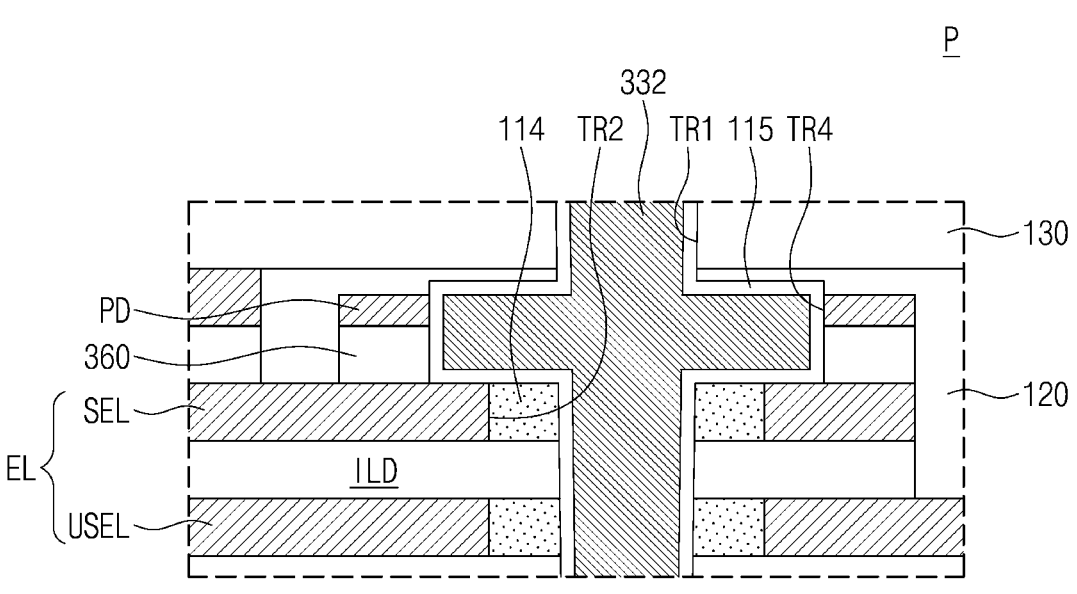

Referring to FIGS. 5, 28 and 29, separation structure openings (not explicitly shown) for forming separation structures WDS may be formed, and the first to third dummy layers DL1, DL2 and DL3 exposed by the separation structure openings may be removed. A conductive material may be deposited in a region formed by the removal of the first to third dummy layers DL1, DL2 and DL3 exposed by the separation structure openings, thereby forming a lower source layer LSL. The lower source layer LSL may be formed to be electrically connected to the memory channel structures MCS.

The preliminary conductive patterns pEL may be removed through the separation structure openings (not shown) for forming the separation structures WDS. A conductive material may be deposited in regions formed by the removal of the preliminary conductive patterns pEL, thereby forming conductive patterns EL. A selection conductive line SEL and a non-selection conductive line USEL may be formed. The preliminary pad pPD may be removed, and a conductive material may be deposited in a region formed by the removal of the preliminary pad pPD, thereby forming a pad PD. The conductive patterns EL may be formed to form a gate stack structure GST including the conductive patterns EL and the insulating patterns ILD which are alternately stacked.

After the formation of the lower source layer LSL and the conductive patterns EL, the separation structure openings (not shown) may be filled with an insulating material to form the separation structures WDS.

Figure 30:
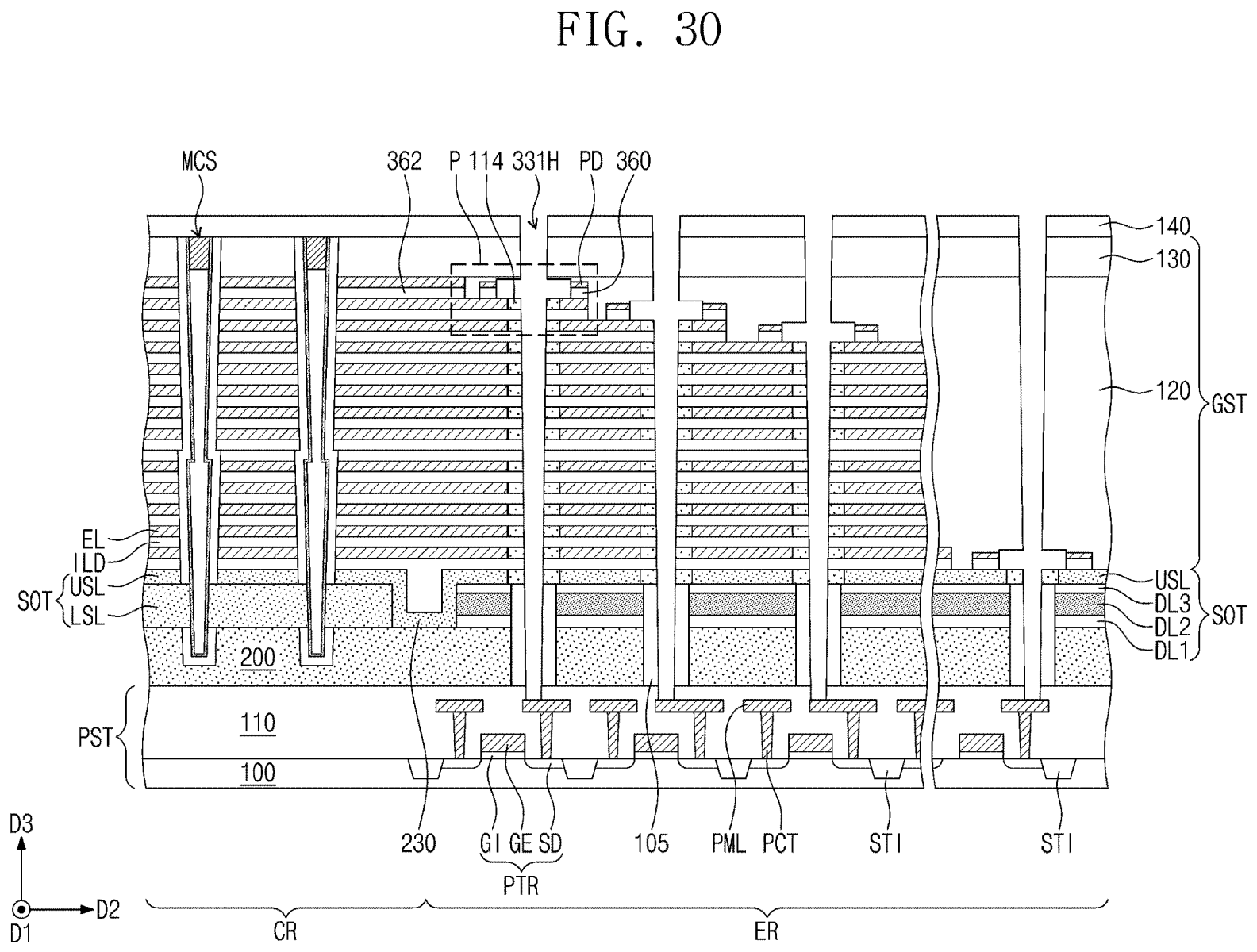
Figure 31:
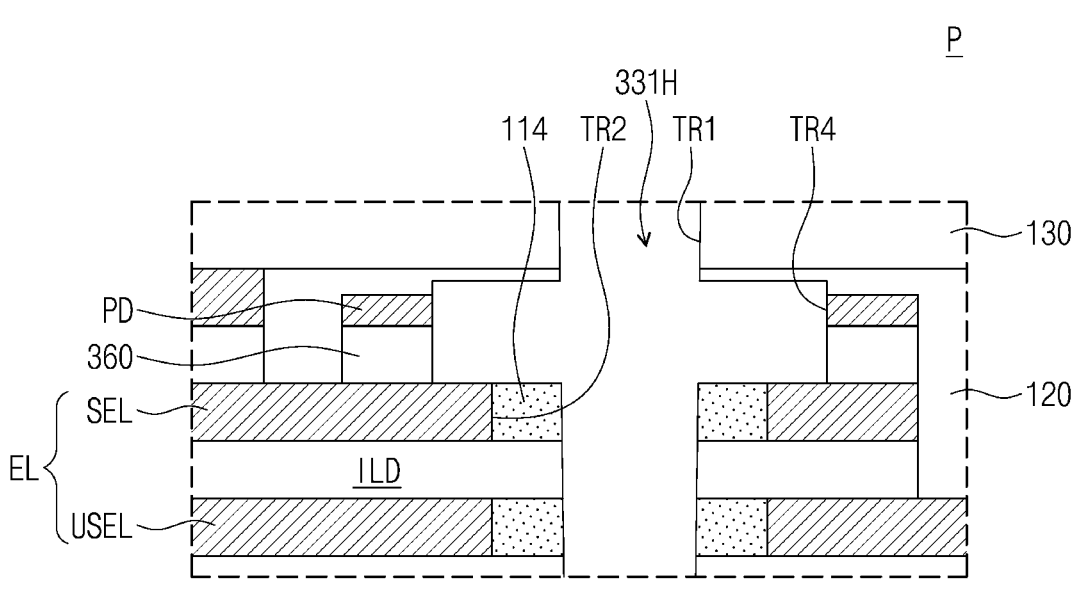

Referring to FIGS. 30 and 31, the preliminary through-plug 332 and the plug sacrificial layer 115 may be removed (e.g., by selective etching) to form a through-plug hole 331H. The through-plug hole 331H may include the first trench TR1 and the fourth trench TR4. The through-plug hole 331H may expose a side surface of the pad PD, the side surface of the pad insulating pattern 360, a top surface of the selection conductive line SEL, and the top surface of the plug insulating pattern 114.

Figure 32:
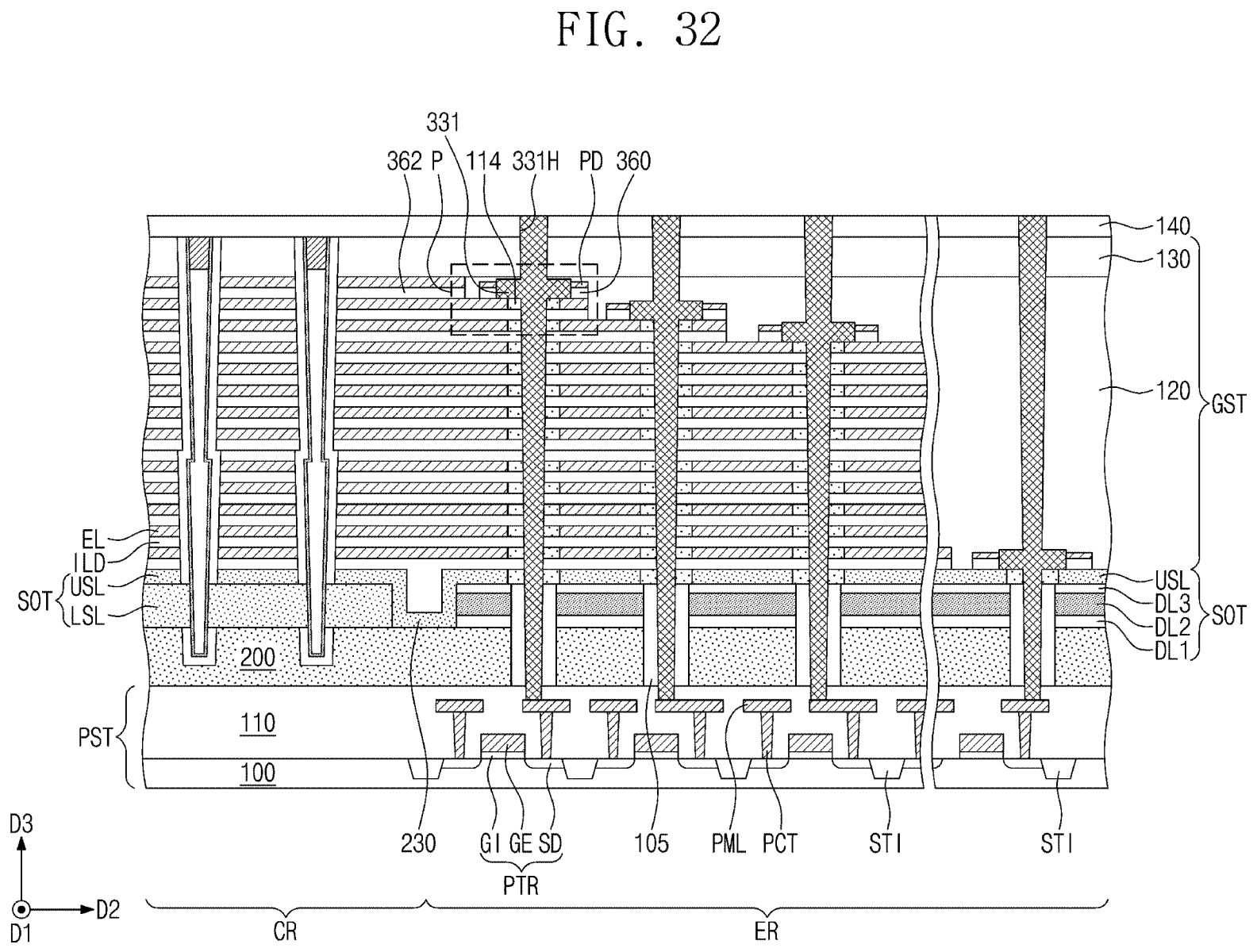
Figure 33:
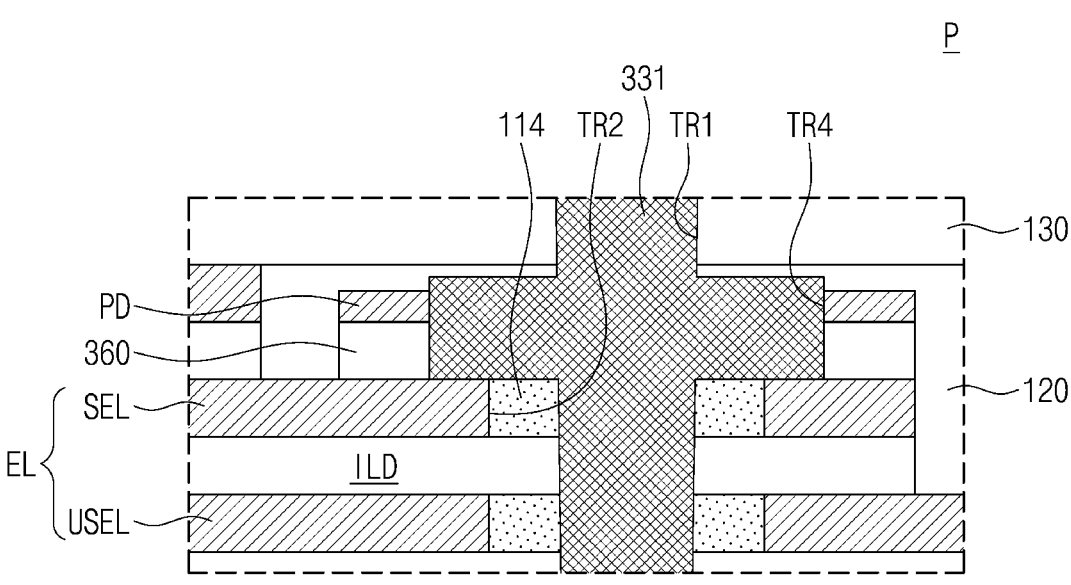

Referring to FIGS. 32 and 33, the through-plug hole 331H may be filled with a conductive material to form a through-plug 331. The through-plug 331 may be electrically connected to the pad PD and the selection conductive line SEL.

Referring again to FIG. 6, a third insulating layer 150 may be formed on the second insulating layer 140. The third insulating layer 150 may be formed by depositing an insulating material on the second insulating layer 140.

A bit line 300 may be formed in the third insulating layer 150. The bit line 300 may include a conductive material. A bit line contact BC may be formed to penetrate the second insulating layer 140 and may be electrically connected to the memory pad PA of the memory channel structure MCS. The bit line contact BC may electrically connect the bit line 300 to the memory channel structure MCS.

A conductive line 191 may be formed in the third insulating layer 150 and may be electrically connected to the through-plug 331. The conductive line 191 may include a conductive material.

According to the inventive concepts, the 3D semiconductor memory device may have the pad which is located in a different layer from the selection conductive line and is thinner than the conductive pattern. In addition, the through-plug may be in contact with the top surface of the selection conductive line. Due to these structural features, it is possible to prevent a loss of an insulating pattern under the selection conductive line in the manufacturing process.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Spatially descriptive terms such as, but not limited to, "above," "over," "below," "under," "upper" and "lower" may be used herein to indicate a position of elements, structures or features relative to one another as illustrated in the figures, rather than absolute positioning. Thus, the semiconductor device may be otherwise oriented (e.g., rotated 90 degrees or at other orientations), and the spatially relative descriptions used herein may be interpreted accordingly.

It will also be understood that when an element such as a layer, region or substrate is referred to as being "atop," "above," "on" or "over" another element, it is broadly intended that the element be in direct contact with the other element or intervening elements can also be present. In contrast, when an element is referred to as being "directly on" or "directly over" another element, it is intended that there are no intervening elements present. Likewise, it should be appreciated that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

While the embodiments of the inventive concepts have been particularly shown and described, it will be understood by one of ordinary skill in the art that variations in form and detail may be made therein without departing from the spirit and scope of the attached claims.

What is claimed is:

1. A three-dimensional (3D) semiconductor memory device, comprising:
   a source structure including a cell region and an extension region;
   a gate stack structure on the source structure, the gate stack structure comprising insulating patterns and conductive patterns which are alternately stacked in a first direction;
   a through-plug penetrating the gate stack structure in the extension region of the source structure;
   a pad in contact with the through-plug; and a pad insulating pattern under the pad,
   wherein the conductive patterns include a selection conductive line in contact with the through-plug,
   wherein the through-plug includes: an extension plug portion extending in the first direction; and a parallel plug portion extending in a second direction intersecting the first direction, and
   wherein a cross-sectional thickness in the first direction of the pad is less than a cross-sectional thickness in the first direction of one of the conductive patterns.

2. The 3D semiconductor memory device of claim 1, wherein a sum of a cross-sectional thickness of the pad insulating pattern and the cross-sectional thickness of the pad is less than a cross-sectional thickness of the parallel plug portion.

3. The 3D semiconductor memory device of claim 1, wherein a level of a top surface of the pad in the first direction is lower than a level of a top surface of the parallel plug portion, relative to a top surface of the selection conductive line.

4. The 3D semiconductor memory device of claim 1, wherein the insulating patterns include an adjacent insulating pattern disposed at the same level as the pad insulating pattern in the first direction, and
   wherein the adjacent insulating pattern is spaced apart from the pad insulating pattern in the second direction.

5. The 3D semiconductor memory device of claim 1, further comprising:
   a plug insulating pattern between the corresponding one of the conductive patterns and the extension plug portion of the through-plug,
   wherein the conductive patterns include a non-selection conductive line under the selection conductive line.

6. The 3D semiconductor memory device of claim 5, wherein a first side surface of the selection conductive line is in contact with the parallel plug portion, and
   wherein a second side surface of the selection conductive line is in contact with the plug insulating pattern.

7. The 3D semiconductor memory device of claim 1, wherein a side surface of the parallel plug portion is in contact with the selection conductive line, the pad insulating pattern, and the pad.

8. The 3D semiconductor memory device of claim 1, wherein a side surface of the parallel plug portion includes a first curved surface, a connection side surface, and a second curved surface,
   wherein the first curved surface is in contact with the selection conductive line, and
   wherein the connection side surface is in contact with the pad and the pad insulating pattern.

9. The 3D semiconductor memory device of claim 8, wherein a bottom surface of the parallel plug portion, which extends in the second direction from the first curved surface of the parallel plug portion, is in contact with the selection conductive line.

10. A three-dimensional (3D) semiconductor memory device, comprising:
   a source structure including a cell region and an extension region;
   a gate stack structure disposed on the source structure and comprising insulating patterns and conductive patterns which are alternately stacked in a first direction;
   a through-plug penetrating the gate stack structure in the extension region of the source structure; and
   a pad in contact with the through-plug,
   wherein the conductive patterns include a selection conductive line in contact with the through-plug, wherein the through-plug includes: an extension plug portion extending in the first direction; and a parallel plug portion extending in a second direction intersecting the first direction, and wherein a level of a top surface of the pad in the first direction is lower than a level of a top surface of the parallel plug portion, relative to a top surface of the selection conductive line.

11. The 3D semiconductor memory device of claim 10, wherein the pad is electrically floating.

12. The 3D semiconductor memory device of claim 10, wherein a height of the pad in the first direction is less than a height of one of the conductive patterns.

13. The 3D semiconductor memory device of claim 10, further comprising:

a pad insulating pattern under the pad, wherein a sum of a cross-sectional thickness of the pad and a cross-sectional thickness of the pad insulating pattern is less than a cross-sectional thickness of the parallel plug portion of the through-plug.

14. The 3D semiconductor memory device of claim 13, wherein a side surface of the parallel plug portion is in contact with the pad, the pad insulating pattern and the selection conductive line.

15. The 3D semiconductor memory device of claim 13, wherein the insulating patterns include an adjacent insulating pattern disposed at the same level as the pad insulating pattern in the first direction, and wherein a cross-sectional thickness of the adjacent insulating pattern is substantially equal to a cross-sectional thickness of the pad insulating pattern.

16. The 3D semiconductor memory device of claim 10, wherein the pad and one or more of the conductive patterns include the same material, and wherein the pad and a corresponding one of the conductive patterns are spaced apart from each other in the second direction.

17. The 3D semiconductor memory device of claim 10, wherein a level of a bottom surface of the parallel plug portion is lower than a level of a top surface of the selection conductive line in the first direction.

18. The 3D semiconductor memory device of claim 10, wherein a side surface of the parallel plug portion includes a first curved surface, a connection side surface, and a second curved surface, wherein the first curved surface is in contact with the selection conductive line, and wherein the connection side surface is in contact with the pad.

19. An electronic system, comprising:

a main board;

a three-dimensional (3D) semiconductor memory device on the main board; and a controller electrically connected to the 3D semiconductor memory device on the main board, wherein the 3D semiconductor memory device comprises:

a peripheral circuit structure including a transistor;

a source structure on the peripheral circuit structure, the source structure including a cell region and an extension region;

a gate stack structure disposed on the source structure and comprising insulating patterns and conductive patterns which are alternately stacked in a first direction;

a through-plug penetrating the gate stack structure in the extension region of the source structure;

a pad in contact with the through-plug; and a pad insulating pattern under the pad, wherein the conductive patterns include a selection conductive line in contact with the through-plug, wherein the through-plug includes: an extension plug portion extending in the first direction; and a parallel plug portion extending in a second direction intersecting the first direction, wherein a sum of a cross-sectional thickness in the first direction of the pad insulating pattern and a cross-sectional thickness in the first direction of the pad is less than a cross-sectional thickness in the first direction of the parallel plug portion, and wherein the cross-sectional thickness in the first direction of the pad is less than a cross-sectional thickness in the first direction of the conductive pattern.

20. The electronic system of claim 19, wherein a level of a top surface of the pad in the first direction is lower than a level of a top surface of the parallel plug portion, relative to a top surface of the selection conductive line.

* * * * *